United States Patent [19]

Blake et al.

[11] Patent Number: 5,381,230
[45] Date of Patent: Jan. 10, 1995

[54] EMISSION SOURCE SPECTRUM STABILIZER

[75] Inventors: James N. Blake, College Station, Tex.; Clarence E. Laskoskie, Scottsdale; Bogdan Szafraniec, Cave Creek, both of Ariz.

[73] Assignee: Honeywell Inc., Minneapolis, Minn.

[21] Appl. No.: 17,685

[22] Filed: Feb. 12, 1993

[51] Int. Cl.[6] .................. G01B 9/02; G01C 19/72
[52] U.S. Cl. .................. 356/345; 356/350; 372/32; 385/14
[58] Field of Search .................. 356/350, 345; 250/227.19, 227.27; 385/12, 14; 372/29, 32

[56] References Cited

U.S. PATENT DOCUMENTS

| | | |
|---|---|---|
| 4,196,964 | 4/1980 | Papuchon . |
| 4,768,851 | 9/1988 | Shaw et al. . |
| 4,792,956 | 12/1988 | Kamin .................. 372/29 |
| 4,842,358 | 6/1989 | Hall .................. 350/96.15 |
| 4,887,900 | 12/1989 | Hall .................. 356/350 |
| 4,890,922 | 1/1990 | Wilson .................. 356/350 |
| 4,915,468 | 4/1990 | Kim et al. . |
| 4,960,319 | 10/1990 | Dankowych . |
| 5,167,444 | 12/1992 | Hall .................. 385/15 |
| 5,208,652 | 5/1993 | Sonobe et al. .................. 356/350 |

FOREIGN PATENT DOCUMENTS

| | | |
|---|---|---|
| 0450747 | 10/1991 | European Pat. Off. . |
| 02522843 | 1/1993 | European Pat. Off. . |
| 2157425 | 10/1985 | United Kingdom . |
| 2216652 | 10/1989 | United Kingdom . |
| 8802474 | 4/1988 | WIPO . |

OTHER PUBLICATIONS

"Optical Fibers of Arbitrary Cross Sections," A. W. Snyder et al, *Journal of the Optical Society of America*, vol. 3, No. 5, May 1986, pp. 600-609.

"Highly Selective Evanescent Modal Filter for Two--Mode Optical Fibers," W. V. Sorin et al, *Optics Letters*, vol. 11, No. 9, Sep. 1986, pp. 581-583.

North Atlantic Treaty Org. #AGARD-CPP-383, R Keil et al., "Effects of Optical Feedback on the Performance of High Data Rate Single-Mode Fiber Systems," Sep. 23-27, 1985, *Guided Optical Structures in the Military Environment*, pp. 14-1 to 14-14.

*Primary Examiner*—Samuel A. Turner
*Attorney, Agent, or Firm*—John G. Shudy, Jr.

[57] ABSTRACT

A spectrum stabilizer for stabilizing the wavelength of light emitted by a source for use in an optical system where the source can have that wavelength altered by varying one or more source parameters, such as source current, temperature and/or alignment of the output end of the source with an optical fiber of the optical system, and wherein light from a selected point in the optical system is coupled to a double mode waveguide for wavelength sensing.

27 Claims, 6 Drawing Sheets

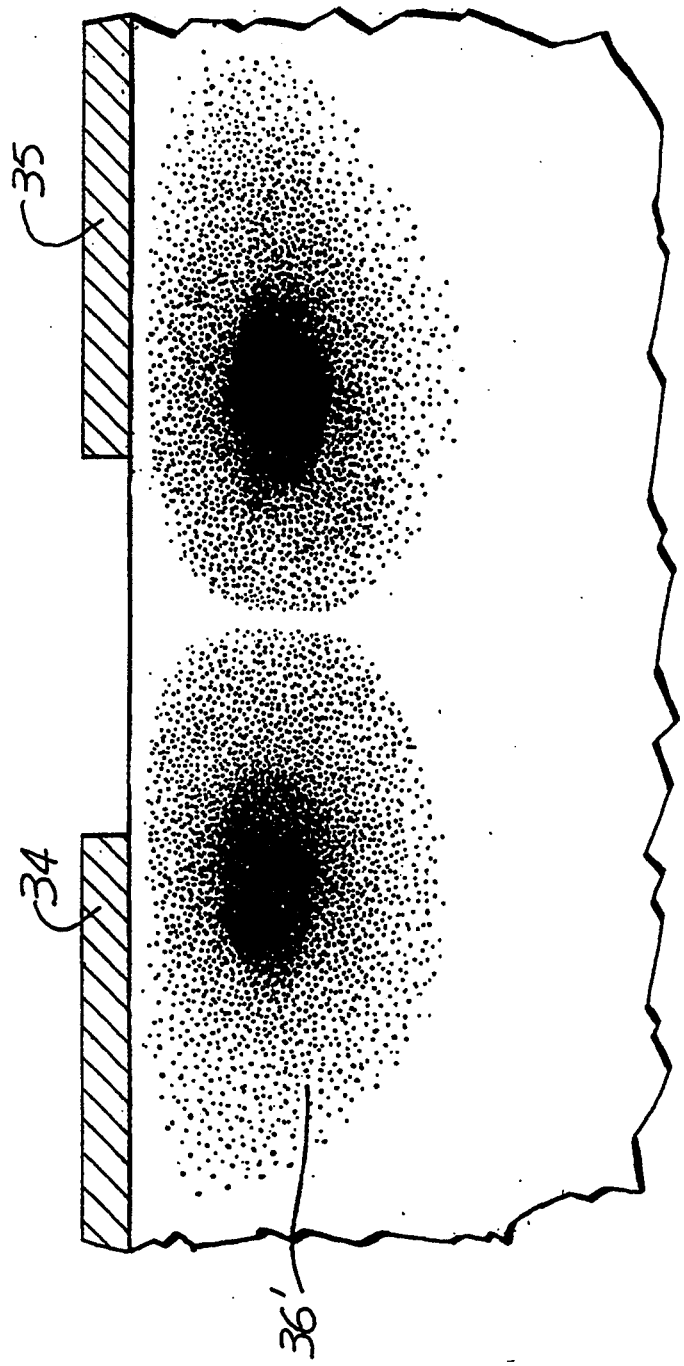

EMISSION SOURCE SPECTRUM STABILIZER

BACKGROUND OF THE INVENTION

The present invention relates to fiber optic gyroscopes used for rotation sensing and, more particularly, to interferometric fiber optic gyroscopes.

Fiber optic gyroscopes are an attractive means with which to sense rotation. They can be made quite small and still be constructed to withstand considerable mechanical shock, temperature change, and other environmental extremes. In the absence of moving parts, they can be nearly maintenance free, and they have the potential to become economical in cost. They can also be sensitive to low rotation rates which can be a problem in other types of optical gyroscopes.

There are various forms of optical inertial rotation sensors which use the well-known Sagnac effect to detect rotation about a pertinent axis thereof. These include active optical gyroscopes which have the gain medium contained in an optical cavity therein, such as the ring laser gyroscope, and passive optical gyroscopes without any gain medium in the primary optical path, such as the interferometric fiber optic gyroscope and the ring resonator fiber optic gyroscope. The avoidance of having the active medium along the primary optical path in the gyroscope eliminates some problems which are encountered in active gyroscopes, such as low rotation rate lock-in, bias drift and some causes of scale factor variations.

Interferometric fiber optic gyroscopes typically employ a single spatial mode optical fiber of a substantial length, typically 100 to 2,000 meters, which length is formed into a coil by being wound on a core to form a closed optical path. An electromagnetic wave, or light wave, is introduced and split into a pair of such waves to propagate in opposite directions through the coil to both ultimately impinge on a photodetector. Rotation about the sensing axis of the core, or the coiled optical fiber, provides an effective optical path length increase in one rotational direction and an effective optical path length decrease in the opposite rotational direction for one member of this pair of electromagnetic waves. The opposite result occurs for the remaining member of the pair of electromagnetic waves for such rotation. Such path length differences between the pair of electromagnetic waves introduce a phase shift between those waves in interferometric fiber optic gyroscopes in either rotation direction, i.e. the well-known Sagnac effect. The use of a coiled optical fiber is desirable because the amount of phase difference shift due to rotation, and so the output signal, depends on the length of the entire optical path through the coil traversed by the two opposing directional electromagnetic waves. Thus, a relatively large phase shift difference can be obtained in a long optical fiber, but also in the relatively small volume taken by that fiber in its being coiled.

The output current from the photodetector system photodiode in response to the opposite direction traveling electromagnetic waves impinging thereon, after passing through the coiled optical fiber, follows a raised cosine function, that is, the output current depends on the cosine of the phase difference between these two waves. Since a cosine function is an even function, such an output function gives no indication as to the relative direction of the phase difference shift, and so no indication as to the direction of the rotation about the axis. In addition, the rate of change of a cosine function near zero phase value is very small, and so such an output function provides very low sensitivity for low rotation rates.

Because of these unsatisfactory characteristics, the phase difference between the two electromagnetic waves is usually modulated by placing an optical phase modulator on one side of the coiled optical fiber. As a result, one of the opposite direction propagating waves passes through the modulator just after entering the coil, while the other wave, traversing the coil in the opposite direction, passes through the modulator just before exiting the coil. In addition, a phase sensitive demodulator is provided to receive the photodetector output current. Both the optical phase modulator and the phase sensitive demodulator are typically operated by a sinusoidal signal generator, but other waveform types of a similar fundamental frequency can also be used.

The resulting signal output of the phase sensitive demodulator follows a sine function, i.e. the output signal depends on the sine of the phase difference between the two electromagnetic waves impinging on the photodiode, primarily the phase shift due to rotation about the axis of the coil. A sine function is an odd function having its maximum rate of change at zero, and so changes algebraic sign on either side of zero. Hence, the phase sensitive demodulator signal can provide both an indication of which direction a rotation is occurring about the axis of the coil, and the maximum rate of change of signal value as a function of rotation rate near a zero rotation rate. That is, the signal has its maximum sensitivity near zero phase shift so that its output signal is quite sensitive to low rotation rates. This is possible, of course, only if phase shifts due to other sources, that is, errors, are made sufficiently small. In addition, this output signal in these circumstances is very close to being linear at relatively low rotation rates. Such characteristics for the output signal of the phase sensitive demodulator is a substantial improvement over the characteristics of the output current of the photodetector.

Reducing erroneous phase shifts from other sources is, however, a difficult problem in fiber optic gyroscopes. Avoidance of erroneous phase shifts in the electromagnetic waves reaching the photodetector requires that each of the interfering waves, at least those of the same wavelength, have traveled over the same optical path, that is, the electromagnetic wave of a wavelength associated with a clockwise direction of travel from the coil and the one of the same wavelengths associated with the counterclockwise direction of the coil each must travel over an indistinguishable optical path from the source to the photodetector absent any rotation of the coil. A system with this characteristic is often termed "reciprocal." At a minimum, the optical paths corresponding to the common wavelength clockwise electromagnetic waves and counterclockwise electromagnetic waves must be identical on an optical ray tracing basis in the absence of rotation. In meeting this requirement, a "minimum reciprocal configuration" has been found to be as shown in FIG. 1 in connection with the coiled optical fiber, 10, shown there. Coiled optical fiber 10 in FIG. 1 is, as indicated above, wound about a core or spool using a single spatial mode optical fiber wrapped about an axis thereof which becomes the axis about which rotation is to be sensed. The use of such a single mode fiber allows the paths of the electromagnetic waves to be defined nearly uniquely, and further allows the phase fronts of such a guided wave to be defined uniquely. This greatly aids in maintaining reciprocity.

In addition, the optical fiber may be a so-called polarization-maintaining fiber in that a very significant birefringence is constructed in the fiber so that birefringence introduced by mechanical stress, which is unavoidable, and by the Faraday effect in magnetic fields, or from other sources, and which can lead to randomly varying phase difference shifts, becomes relatively insignificant. Thus, either the high refractive index axis, i.e. the slower propagation axis or the "x" axis, or the low refractive index axis, i.e. the faster propagation axis or the "y" axis, is chosen for primarily propagating the electromagnetic waves depending on the other optical components in the system.

On the other hand, such polarization-maintaining optical fiber is relatively expensive so that there is a substantial desire to be able to use just ordinary single spatial mode optical fiber. That desire can be satisfied with the use of primarily ordinary single mode optical fiber for coiled optical fiber 10. However, the optical fiber in coil 10 is then not entirely ordinary single spatial mode optical fiber because of a depolarizer, 10', (having the splices associated therewith shown in dashed lines to indicate that this is an alternative) is included relatively near one end thereof, although this depolarizer could be located anywhere in coil 10. This depolarizer is required because the ordinary single spatial mode optical fiber used in a very great fraction of this version of coil 10 is subject to having changing birefringence therein introduced by mechanical stress changing with temperature, and by the Faraday effect in magnetic fields. This changing birefringence will lead to randomly varying polarization rotations of the beams passing therethrough even to the extent of being so great that the interference of those beams at the photodetector vanishes.

Depolarizer 10' is in coil 10 positioned near one end in coil 10 for ease of winding that coil. Such a depolarizer tends to closely equalize the electromagnetic wave intensities in, and decorrelate, the two orthogonal polarization modes permitted therein and overwhelm the effects of the randomly changing birefringence in the ordinary single spatial mode fiber in the rest of coil 10 thus preventing such opposing direction beam interference at the optical subsystem portion output photodiode from vanishing.

Such a depolarizer can be formed with two lengths of polarization-maintaining fiber, 10" and 10"', with the latter being substantially twice as long as the former to thereby cause approximately twice the optical delay caused by the other. In each of these lengths, there is a high refractive index axis, i.e. the slower propagation axis or the "x" axis, and a low refractive index axis, i.e. the faster propagation axis or "y" axis, which are orthogonal to one another. The lengths are joined in a fused splice in such a manner that the "x" axis in one length is approximately equidistant from the "x" and "y" axes in the other length, i.e. the "x" axis in the former is at 45° from each of the "x" and "y" axes in the other. The opposite ends of each of the depolarization fiber lengths are then spliced by fusing to corresponding portions of the single spatial mode ordinary optical fiber in coil 10 so that a beam of light, propagating through any of the depolarizer or either of the single spatial mode ordinary optical fiber portions, substantially propagates through all of them.

Coil 10, as either polarization-maintaining optical fiber or as ordinary single mode optical fiber with depolarizer 10' therein, is typically wound on a spool using the "quadripole" technique so that similarly located points in the coil with respect to center are near one another. This reduces the effects of time-varying phenomena, such as thermal gradients, from affecting opposite direction propagating electromagnetic waves differently from one another.

The electromagnetic waves which propagate in opposite directions through coil 10 are provided from an electromagnetic wave source, or light source, 11, in FIG. 1. This source is typically a superluminescent diode or, alternatively, a laser diode operating below its threshold for stimulated emission, either of which provide electromagnetic waves typically in the near-infrared part of the spectrum with a typical wavelength of 1.3 $\mu$m. Source 11 must have a short coherence length for emitted light to reduce the phase shift difference errors between these waves due to Rayleigh scattering at scattering sites in coil 10. Because of the nonlinear Kerr effect in coil 10, differing intensities in the two propagating waves can also lead to phase difference shifts therebetween. This situation can also be aided by the use of a short coherence length source for source 11 which leads to modal phase shift canceling. Rayleigh scattering and the nonlinear Kerr effect lead to non-reciprocal phase shifts between the counter rotating electromagnetic waves in coil 10 even in a minimum reciprocal configuration. A superluminescent diode, or a laser diode operating below threshold, each have a wide emission spectrum compared to that of a laser diode operating past its threshold in the stimulated emission mode of operation.

Between laser diode 11 and fiber optic coil 10 in FIG. 1 there is shown an optical path arrangement formed by an extension of the ends of the optical fiber forming coil 10 to some optical coupling components which separate the overall optical path into several optical path portions. A portion of polarization-maintaining or ordinary single spatial mode optical fiber is positioned against a face of laser diode 11 at a location of optimum light emission therefrom, a point from which it extends to a first optical directional coupler, 12, to be joined thereto. If, on the other hand, coupler 12 is formed by fusing two optical fibers together in a coupling region, either a pair of polarization-maintaining optical fibers or a pair of ordinary single spatial mode optical fibers, the excess length of one of the optical fibers may be positioned against diode 11 to provide this optical path between diode 11 and this wave coupling region of coupler 12, or the excess length may be spliced to another polarization-maintaining optical fiber or ordinary single spatial mode optical fiber extending from diode 11 depending, in either of these situations, on which of the coil 10 configurations described above is chosen or the choice of variations of systems having one of those configurations therein.

Optical directional coupler 12 has light transmission media therein which extend between four ports, two on each end of that media, and which are provided on each end of coupler 12 in FIG. 1. One of these ports has the optical fiber extending from laser diode 11 positioned thereagainst (or vice versa for a fused coupler, i.e. a fiber extending from the coupler coupling region to be positioned against the emitting face of diode 11). At the other port on the same end of optical coupler 12 there is shown a further optical fiber positioned thereagainst (or alternatively extending from the fused coupler if used) which extends to be positioned against a photodiode, 13, which is electrically connected to a photodetection system, 14. This optical fiber may be a polarization-maintaining optical fiber or it may be an ordinary single spatial mode optical fiber. In practice, as indicated above, coupler 12 may be formed from fused lengths of such optical fiber so that the remaining lengths past the fused portion, or the light coupling region therein, extend either all the way to laser diode 11 and photodiode 13, or are spliced to other optical fibers extending therefrom.

Photodiode 13 detects electromagnetic waves, or light waves, impinging thereon from the portion of the optical fiber positioned thereagainst (or extending thereto) and provides a photocurrent in response. This photocurrent, as indicated above, in the situation of two nearly coherent electromagnetic waves impinging thereon, follows a raised cosine function in providing a photocurrent output which depends on the cosine of the phase difference between such a pair of electromagnetic waves. Photodiode 13 is operated in either the photovoltaic mode or the photoconductive mode, as needed, into an amplifier circuit of appropriate impedance to provide a photocurrent which is substantially a linear function of the impinging radiation intensity, and is typically a p-i-n photodiode.

Optical directional coupler 12 has another optical fiber against a port at the other end thereof which extends to a polarizer, 15. This may be polarization-maintaining or a single spatial mode optical fiber depending on choices of coil 10 configurations and system variations having one or the other of those configurations. At the other port on that same side of coupler 12 there is a non-reflective termination arrangement, 16, involving the excess length of one of the optical fibers fused together forming coupler 12 or, again, another optical fiber spliced to such an excess length. This optical fiber leading to arrangement 16 can again be polarization-maintaining optical fiber or ordinary single spatial mode optical fiber.

Directional optical coupler 12, in receiving electromagnetic waves, or light, at any port, or at any end of an excess portion of optical fiber extending past the coupling region therein, transmits such electromagnetic waves so that a preselected fraction thereof, typically one-half, appears at each of the two ports, or ends of the two excess optical fiber lengths past the coupling region, which are at the opposite end of coupler 12 from that having the incoming port or excess optical fiber length receiving the incoming waves. On the other hand, no electromagnetic waves are transmitted to the port or excess fiber length which is on the same end of coupler 12 as is the incoming port. The polarization of the incoming electromagnetic waves with respect to the principal refringent axes at the input port can be fairly well preserved at the corresponding axes of the two output ports if coupler 12 is formed of two portions of polarization-maintaining optical fiber with the principal axes suitably aligned, but there will be some coupling of waves between axes in the coupling region of the coupler. If a pair of ordinary single spatial mode optical fiber portions are fused together to form coupler 12, the polarization of the incoming electromagnetic waves with respect to the principal birefringent axes in the polarization-maintaining component can be fairly well preserved through the coupling region to the other fiber, but there may be substantial coupling thereafter even before coupled waves reach the output port of the ordinary single spatial mode optical fiber.

Polarizer 15 is used because, even in a single spatial mode optical fiber, two polarization modes are possible for electromagnetic waves passing through such a fiber along orthogonal axes. Thus, polarizer 15 is provided for the purpose of transmitting the electromagnetic wave component along one of these axes, for one of these polarization modes, between the optical fibers connected to the ports on either end thereof. At the same time, polarizer 15 substantially blocks transmission along the remaining one of these axes.

Polarizer 15, however, is not capable of entirely blocking electromagnetic waves in the one state of polarization that it is intended to block. This shortcoming in the extinction coefficient thereof leads to a non-reciprocity between two opposite direction traveling waves over the optical paths they follow, and so to a non-reciprocal phase shift occurring between them which can vary with the conditions of the environment in which the polarizer and the remainder of the system of placed.

Positioned against the port of polarizer 15 on the end opposite that connected with optical directional coupler 12 is another optical fiber which extends to a further optical directional coupler, 17, this fiber and lo this coupler being formed of pairs of polarization-maintaining or ordinary single spatial mode fibers again depending on the choices of coil 10 configurations and system variations having one of these configurations therein. Directional coupler 17 also transmits received electromagnetic waves so that a preselected fraction thereof, again typically one-half, appears at each of the two ports which are at the opposite end of coupler 17 from that having the incoming port. Again, no electromagnetic waves are transmitted to the port or excess fiber length which is on the same end of coupler 17 as the incoming port. The polarization of incoming electromagnetic waves at an input port will be preserved at the corresponding pair of output ports to the extent and manner described for coupler 12. If directional coupler 17 is formed using a pair of portions of polarization-maintaining optical fiber, this will lead to an optical performance in the optical subsystem portion of FIG. 1 which would be similar to the performance of such a subsystem if directional coupler 17 was alternatively formed in an integrated optic chip.

The second port on the same end of coupler 17 from which the first port is coupled to polarizer 15 is connected in a non-reflective termination arrangement, 18, using a further ordinary single spatial mode optical fiber portion or a polarization-maintaining optical fiber. One of the ports on the opposite end of coupler 17 is connected to a further optical component in the optical path portion extending thereto from one end of the optical fiber in coil 10. The other port on that end of coupler 17 is directly coupled to the remaining end of optical fiber coil 10, and this coupling is typically accomplished through a splice between the excess length of an optical fiber past the coupling region in coupler 17 and the optical fiber in coil 10.

Between coil 10 and coupler 17, on the side of coil 10 opposite the directly connected side thereof, there is provided an optical phase modulator, 19. Optical phase modulator 19 has a port on either end of the transmission media contained therein which occur in FIG. 1 at the opposite ends of that phase modulator. The polarization-maintaining or ordinary single spatial mode optical fiber from coil 10 is positioned against a port of modulator 19. The polarization-maintaining or ordinary single spatial mode optical fiber extending from coupler 17 is positioned against the port on the opposite end of modulator 19.

Optical phase modulator 19 can be of the variety formed by wrapping an optical fiber portion around a piezoelectric cylinder so that the fiber may be stretched by the application of voltage to that cylinder, or this phase modulator may be formed as an optical integrated chip using a substrate of lithium niobate, for instance, with metallic depositions provided thereon as electrodes and positioned adjacent a waveguide provided therein. Such depositions typically result in plate-like electrode structures on the substrate to both provide electrical contacts to the modulator and a means through which varying electric fields can be established in the waveguide to result in the necessary modulation of the phase of electromagnetic waves passing through that waveguide.

Optical phase modulator 19 is thus capable of receiving electrical signals on these plates to cause the introduction of phase differences in electromagnetic waves transmitted therethrough by changing the index of refraction of the transmission medium, or transmission media, because of the resulting electric fields established therein to thereby change the effect of optical path lengths experienced by such waves. Optical phase modulators constructed in optical integrated circuit form have a large bandwidth, i.e. are able to provide phase changes following a waveform that has substantial high frequency content. Note also that polarizer 15, and source and loop optical directional couplers 12 and 17, could also be formed in similar integrated optic chips, including possibly being formed in a common such chip.

Directional optical coupler 17 serves as a beam-splitting apparatus in that electromagnetic waves emitted from source 11 that are transmitted through coupler 12 and polarizer 15 to be received by coupler 17 are there split in approximately half with a corresponding one of the resulting portions passing out of each of the two ports on the opposite end of coupler 17. Out of one port on that opposite end of coupler 17 the corresponding electromagnetic wave portion passes through depolarizer 10' if used, the rest of optical fiber coil 10, through optical phase modulator 19 and back to coupler 17. A portion of that electromagnetic wave passes through the port of coupler 17 leading to polarizer 15 and then to coupler 12 where a part of the remainder of the wave portion is transmitted to photodiode 13.

The other portion of the electromagnetic wave after the split in coupler 17 leaves that other port on the coil 10 end of coupler 17 to first pass through optical phase modulator 19, through most of optical fiber coil 10, and then through depolarizer 10' if used to reenter coupler 17 and, again, from there follow the same path as the first portion previously described to finally impinge in part on photodiode 13. In the presence of modulation provided by phase modulator 19, and in the presence of any rotation of coil 10 about its axis, or because of effects in coupler 17, some of the energy of the combined waves will be lost through non-reflective arrangement 18.

In an interferometric fiber optic gyroscope using polarization-maintaining optical fiber for coil 10 without a depolarizer, the electromagnetic waves passing through coil 10 are all intended to take the same optical path. In an interferometric fiber optic gyroscope using ordinary single spatial mode optical fiber for coil 10 with a depolarizer, however, the nature of the ordinary single spatial mode optical fiber used in coil 10 gives rise to random occurrences of birefringence therein induced by various causes, including stress change due to temperature changes, which result in the possibility of different optical paths being available for the waves to propagate over. The use of depolarizer 10' forces waves to differing polarization states periodically over wavelength, and so to corresponding different optical paths. Thus, the polarization history of electromagnetic waves through coil 10 and depolarizer 10' together is wavelength dependent. Nevertheless, any waves reaching the transmission axis of polarizer 15 at a point in time will have had the same polarization history. Assuming then that depolarizer 10' distributes the optical waves between the polarization states uniformly, depolarizer 10' acts to equalize the wave energy in each of the optical paths.

The choice in an interferometric gyroscope system of which of the configurations describe above for coil 10 to use will depend on many factors, as will the choice of system variations having one or the other of the coil configurations therein. A number of different system configurations for each of the coil configurations (as well as variations of those configurations) can be found in the earlier filed copending U.S. patent applications entitled "Configuration Control of Mode Coupling Errors" having Ser. No. 07/791,719 by J. Blake and J. Feth and "Configuration Control of Mode Coupling Errors" having Ser. No. 07/890/938 by J. Blake, J. Feth and B. Szafraniec each hereby incorporated herein by reference.

As indicated above, photodiode 13 provides an output current proportional to the intensity of the combined electromagnetic waves, or light waves, impinging thereon dependent on the phase difference therebetween. The arrangement of FIG. 1 leads to the electromagnetic waves propagating in opposite directions through coil 10 to in part reach photodiode 13 so that the intensity thereon is an average of the electromagnetic waves traveling in both directions over each polarization determined optical path, i.e. averaged over the wavelengths present, but including primarily only those waves propagating over those optical paths over which returning waves have a polarization at polarizer 15 which is substantially passed by that polarizer. That is, the returning waves included in the averaging process are primarily just those following optical paths which extend through the transmission axis of polarizer 15. Corresponding photocurrent from photodiode 13 follows a raised cosine function in being based on the cosine of the average phase difference between portions of each of the electromagnetic waves propagating in opposite directions in coil 10 impinging thereon taken over the wavelengths present therein. This relationship follows because the photocurrent depends on the resulting optical intensity of the pairs of opposite direction propagating electromagnetic waves incident on photodiode 13 which intensity will vary depending on how much constructive or destructive interference occurs between these waves at that diode. This interference of waves will change with rotation of the coiled optical fiber forming coil 10 about its axis as such rotation introduces a phase difference shift between the waves because of the Sagnac effect. Further, additional phase difference shifts will be introduced by optical phase modulator 19 as will be described in connection with the electrical system shown in the remainder of FIG. 1.

The electrical system portion of FIG. 1 shows an open loop fiber optical gyroscope system, but could also be converted to a closed loop fiber optic gyroscopic system, i.e. using feedback around the system shown. This would be accomplished by having the electrical system provide a feedback signal based on the output of the system shown in FIG. 1 to control a further optical phase modulator inserted in the optical path next to modulator 19, or to additionally control modulator 19. Optical phase modulator 19 is of the kind described above and is used in conjunction with a phase sensitive demodulator, or phase detector, for converting the output signal of photodiode 13 and photodetector system 14, following a cosine function, to a signal following a sine function. Following such a sine function provides, in that output signal, information both as to rate of rotation and as to direction of that rotation about the axis of coil 10. Modulator 19 is operated by a sinusoidal signal provided at the output of a bias modulation signal generator, 20, which also provides this signal to operate a phase detector which, as indicated, is a phase sensitive demodulator.

Thus, the output signal from photodetector system 14, including photodiode 13, is provided to an amplifier, 21, where it is amplified and passed through a filter, 22, to a phase detector, 23. The phase sensitive demodulator serving as phase detector 23 is a well-known device. Such a phase sensitive demodulator senses changes in the first harmonic, or fundamental frequency, of signal generator 20 to provide an indication of the relative phase of the pair of electromagnetic waves impinging on photodetector 13. This information is presented by phase detector 23 in an output signal following a sine function, i.e. the sine of the phase difference between the two electromagnetic wave portions impinging on photodiode 13.

Bias modulation signal generator 22, in modulating the electromagnetic wave portions in the optical path at a frequency set by the output signal supplied thereby as described above, also generates a strong second harmonic component in photodetector system 14. Filter 22 is a notch filter for removing this second harmonic component.

In operation, the phase difference changes in the two opposite direction propagating electromagnetic waves passing through coil 10 in the optical paths therethrough to reach photodiode 13 will lead to average net phase difference changes which will be relatively small, and which will vary relatively slowly compared to the phase difference changes due to optical phase modulator 19 and bias modulator signal generator 20. Any average phase difference shift due to the Sagnac effect will merely shift the average phase difference between the electromagnetic waves, and the output signal from phase sensitive demodulator 23, after photodiode signal demodulation therein, will depend on the sine of this phase difference multiplied by an amplitude scaling factor set by the modulation of the waves due to phase modulator 19 and signal generator 20. This synchronous demodulation thus substantially extracts from the photodiode output signal the amplitude of the sinusoidal modulation frequency component at the modulation frequency introduced by signal generator 20 and modulator 19, which includes the result of any rotation of coil 10 about its axis, to provide the demodulator output signal.

As indicated above, however, additional phase shifts between the counter-propagating electromagnetic waves can be introduced even with the fiber optic gyroscope system in a minimum reciprocal configuration by various effects occurring therein. Typically, a significant source of such non-reciprocal phase shifts from other than the Sagnac effect is the following of different optical paths by the two different polarization components of the counter-propagating electromagnetic waves leading to phase shift errors in the output indistinguishable from Sagnac phase shifts as described in the references incorporated above. Other such sources are backscattering in the optical paths and intensity dependence of the index of refraction along the optical paths.

Another source of variation in the phase shifts between the counter-propagating electromagnetic waves leading to gyroscope output errors is due to variation in the spectral output of source 11. This variation will be typically due to temperature changes in and about this source, and to aging effects occurring in the source.

Such output errors due to source spectral variation, $\Delta\phi_e$, can be seen to arise from the well known expression for the Sagnac phase shift, $\phi_r$, between the counter-propagating waves due to an angular rate, $\Omega$, about the axis of symmetry of coil 10 perpendicular to the plane of that coil in which these waves propagate written as $$\phi_r = \frac{2\pi LD}{\lambda c} \Omega.$$

The symbol L represents the effective length of coil 10 and the symbol D represents the diameter of that coil. The symbol c represents the speed of light in free space, and the symbol $\lambda$ represents a wavelength of the detected counter-propagating waves interfering to an extent set by the phase shift $\phi_r$. This last expression is more easily dealt with if converted to depending on optical frequency rather than on wavelength through use of the well-known relationship between optical frequency and wavelength $\lambda = c/\nu$, where $\nu$ is the optical frequency, the result being $$\phi_r = \frac{2\pi LD}{c^2} \nu\Omega$$

The value of $\phi_r$ is detected by the electronic signal processing system portion of the system of FIG. 1, beginning at photodiode 13, which provides an output voltage signal proportional to that parameter. Clearly, the last expression shows that the measured value of $\phi_r$ by the electronic signal processing system will reflect both changes due to angular input rate $\Omega$ and to changes in the value of $\nu$. Changes in $\phi_r$ due to changes in $\nu$ at any angular input rate $\Omega$ represent the error $\Delta\phi_e$. Thus, for any given angular rate $\Omega$, the weighted average of $\phi_r$ with respect to frequency, $<\phi_r>_\nu$, weighted by the power spectrum $P_{13}$ of the electromagnetic waves impinging on photodiode 13, or $$<\phi_r>_\nu = \frac{\int P_{13}(\nu)\phi_r(\nu)d\nu}{\int P_{13}(\nu)d\nu},$$

is desired be held fixed over time after calibration of the electronic signal processing portion of the system of FIG. 1. Using the last two expressions gives the result $$<\phi_r>_\nu = \frac{2\pi LD}{c^2} \Omega \frac{\int P_{13}(\nu)\nu d\nu}{\int P_{13}(\nu)d\nu},$$

or, $$<\phi_r>_\nu = \frac{2\pi LD}{c^2} \Omega \bar{\nu}_{13},$$

where $$\bar{\nu}_{13} \triangleq \frac{\int P_{13}(\nu)\nu d\nu}{\int P_{13}(\nu)d\nu}.$$

Thus, the average optical frequency (and so wavelength) in the emission spectrum of photodiode 13, $\bar{\nu}_{PD}$, must be held fixed if the average $<\phi_r>_\nu$ is to be held fixed over optical frequency for a given input angular rate $\Omega$. Hence, a system is desired for use in connection with the system of FIG. 1 to hold $\bar{\nu}_{PD}$ essentially constant after calibration of the electronic signal processing portion of the system of FIG. 1.

SUMMARY OF THE INVENTION

The present invention provides a spectrum stabilizer for stabilizing with respect to wavelength an emission spectrum of electromagnetic waves emitted by a source for insertion into a selected optical system where the source can have that emission spectrum shifted over wavelength by varying one or more source parameters. Electromagnetic waves from a selected point in the optical system are coupled to a double mode waveguide means where they propagate at least in part in two different spatial modes with differing group velocities for each over a range of wavelengths including at least part of the source emission spectrum. Such electromagnetic waves, after propagation through these two modes, are coupled to a photodetector to impinge in combination thereon and result in an output signal used to operate a source actuator to vary at least one source parameter accordingly. The electromagnetic waves can be phase modulated in the double mode waveguide and demodulated in the source actuator.

The source actuator may have a combination of arrangements for relocating the emission spectrum over wavelength, including arrangements to control the current therethrough, the temperature thereof, angular relationship with the insertion point of the optical system, so that varying a further source parameter is also effective for this purpose. Varying either of the source parameters will also result in changes in the intensity of the emitted electromagnetic waves, and a data processing arrangement can be used to determine the best values of each source parameter in reaching the desired intensity and emission spectrum wavelength location.

BRIEF DESCRIPTION OF THE DRAWINGS

FIGS. 4A and 4B show in cross section view a portion of an integrated optics chip.

DETAILED DESCRIPTION OF THE PREFERRED EMBODIMENTS

Figure 1:
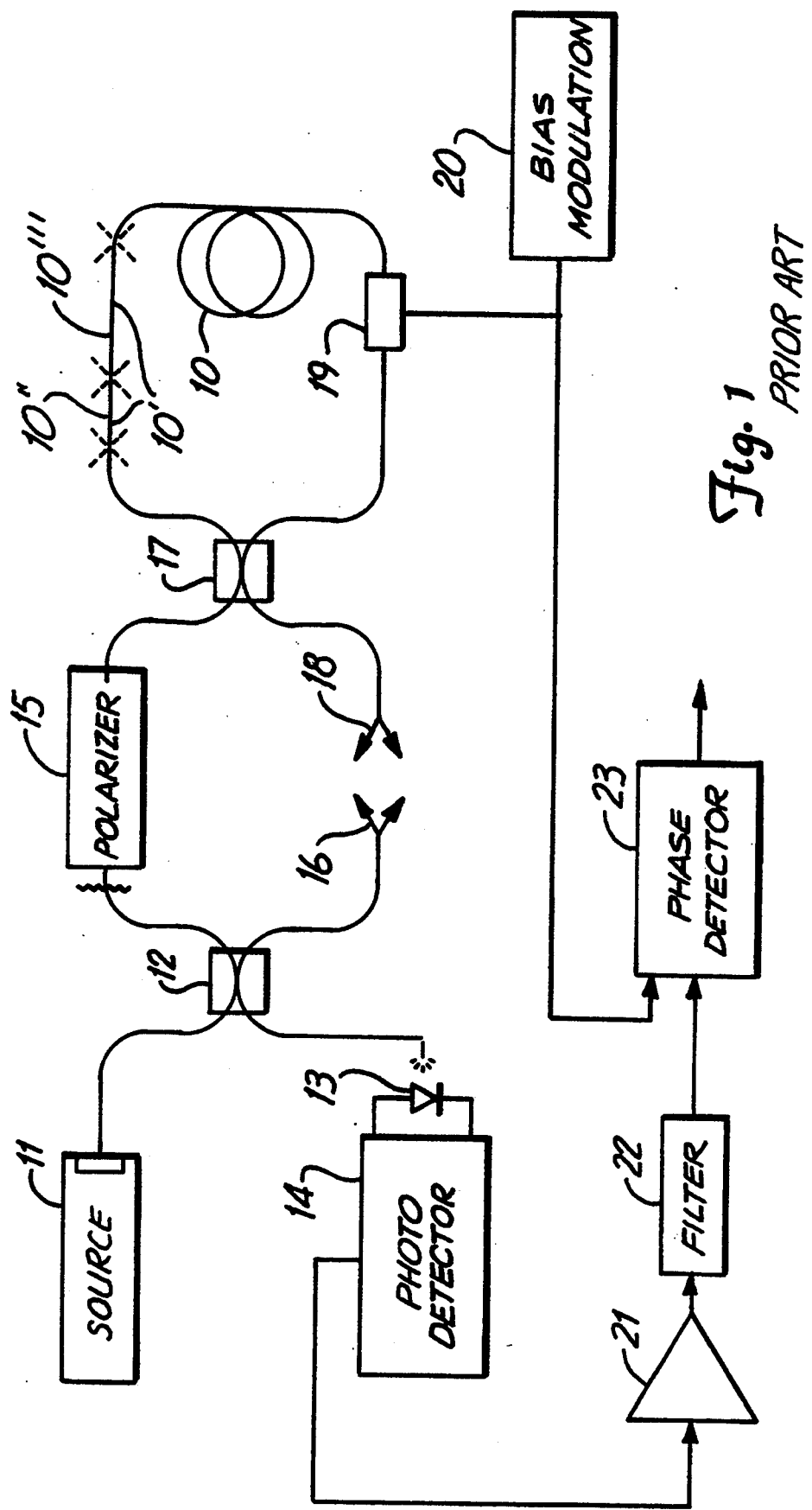
FIG. 1 shows a system schematic diagram combining a signal processing arrangement and an optical transmission path and device arrangement known in the prior art.

Control of the average optical frequency of those electromagnetic waves reaching photodetector 13 from source 11, after propagating through the remainder of the optical subsystem portion of the system shown in FIG. 1, first requires somehow measuring deviations of the spectra, perhaps represented by the corresponding average optical frequencies, from the initial values thereof at the calibration of the electronic signal processing subsystem. That information must then be used to shift the average optical frequency of source 11 to counteract any such deviations, i.e. some kind of feedback control system is needed.

The measurement of deviations of the average optical frequency reaching photodiode 13 depends on measuring the spectrum of those electromagnetic waves reaching that photodiode or the average optical frequency thereof. However, the system of FIG. 1 provides no obviously convenient location therein to obtain a sample of the electromagnetic waves about to reach photodiode 13 without some system modification. The most obvious modification is the addition of a directional coupler in the optical fiber link shown between source coupler 12 and photodiode 13 to thereby permit a sampling of the electromagnetic waves enroute to that photodiode. Although such an arrangement would certainly sample the most pertinent electromagnetic waves, closest to photodiode 13, that arrangement would also lead to further imposing the coupler characteristics of the added coupler on the electromagnetic waves obtained thereby for measurement. That is, the coupled electromagnetic waves received for measurement would not necessarily have the same spectrum as those waves passing straight through the added coupler to impinge on photodiode 13 if the added coupler, like many directional couplers, had a coupling characteristic dependent to a significant extent on the wavelength of the coupled waves. In addition, the formation of fused couplers tends to be an art of some difficulty and so adding it to the system of FIG. 1 may significantly increase the expense of constructing that system.

If, however, the characteristics of the electromagnetic waves reaching photodiode 13 maintain a substantially fixed spectral relationship with electromagnetic waves obtained elsewhere in the system of FIG. 1, then the measurement of waves at such other locations will approximately provide as good a basis for representing the effects of the emission spectrum of source 11 as would electromagnetic waves about to impinge on photodiode 13. Hence, such measurements at other locations, which possibly may be more conveniently made, should be as effective as the basis for stabilizing the optical frequency spectrum of source 11.

One clearly more convenient location in the system of FIG. 1 at which to obtain some of the electromagnetic waves provided by source 11 passing through that system is at non-reflective termination arrangement 16 supplied such through source coupler 12. The electromagnetic waves available there will be relatively intense having passed through only one optical component in the system, source coupler 12, and so should be a relatively good measurement base for the spectral content of that source. Further, only the coupling characteristic of source coupler 12 will be impressed on the electromagnetic waves received at termination arrangement 16 so that they might quite well represent the spectral situation of source 11.

On the other hand, these waves at termination arrangement 16 may not so well represent the characteristics of the electromagnetic waves reaching photodiode 13 which will have been transmitted through the direct transmission side of source coupler 12, then through the remaining components of the system of FIG. 1, and finally transmitted back through source coupler 12 again but this time after having been coupled to the opposite side of source coupler 12 to reach photodiode 13. If the optical components in the optical subsystem of the system of FIG. 1 have characteristics which depend on the wavelengths of the electromagnetic waves propagating therethrough, the spectra of the waves emerging to impinge on photodiode 13 may well differ from the emission spectrum of source 11. Further, if the wavelength dependence of these optical components change over time because of temperature changes in, or aging of, those components, the spectra of the waves at termination arrangement 16 may have a varying relationship with both the emission spectrum of source 11 and the spectra of the waves reaching photodiode 13. As a result, the waves measured at termination arrangement 16 may not represent the emission spectrum of source 11 nor the spectra of the waves impinging on photodiode 13 very well as a basis for reducing spectral shift based errors.

Thus, another relatively convenient system electromagnetic wave measure location to be alternatively considered is at non-reflective termination arrangement 18 of loop coupler 12. The electromagnetic waves measured there have already passed through much of the optical subsystem portion of the system of FIG. 1 on the way to photodiode 13 and so may be more representative of the spectra of the electromagnetic waves reaching photodiode 13. Nevertheless, they still have not passed through all of that subsystem and thus could also not be very representative of the waves at photodiode 13.

Such a lack of representativeness is quite likely to be the situation if an integrated optics chip is used in the implementation of the optical subsystem portion of the system of FIG. 1 rather than using the all optical fiber implementation described above. In such a chip, polarizer 15, loop coupler 17 and phase modulator 19 would very likely all be integrated therein. The waveguides in such a chip typically exhibit significant wavelength dependent loss which changes with temperature and which would be likely to significantly alter the spectra of waves at photodiode 13 from the spectra of those at loop coupler 17 in the chip. Further, in such an integrated optics chip implementation, there would be no easily available termination arrangement at the equivalent of loop coupler 17, likely a waveguide "Y" junction. Thus, an integrated optics implementation will often favor the use of another directional coupler in the optical fiber link between the source coupler and photodiode 13 to measure the electromagnetic waves about to impinge on that photodiode. Alternatively, another "Y" junction in one of the chip waveguides could be provided as a source of electromagnetic waves to be measured for a feedback loop to control the emission spectrum of source 11 with the added advantage of the splitting factor for that junction being less wavelength dependent.

In situations, however, where there are not too great and changeable wavelength dependent losses in the optical subsystem components, such as in the all optical fiber implementation described above, sampling for measurement of electromagnetic waves at other locations in the optical subsystem is attractive from a cost and convenience standpoint. In the all optical fiber system of FIG. 1, the losses will essentially all be losses in the optical fiber which will be quite small and not very strongly wavelength dependent over the spectral width of source 11. Typically, the only significant wavelength dependent characteristic will be the coupling characteristic of the source and loop couplers each leading to a wavelength dependent coupling coefficient.

Thus, sampling the electromagnetic waves provided at termination arrangement 16 for measurement can be both acceptable and convenient to provide an error signal source for a feedback loop, as an alternative to inserting a directional coupler between source coupler 12 and photodiode 13, to control the emission spectrum of source 11. Acceptability, however, requires that the wavelength dependence of the source coupler power transmission coefficient, which will vary with temperature, not result in those changes occurring in the spectra of electromagnetic waves impinging on photodiode 13 being too different from changes in the controlled emission spectrum of source 11. Further, acceptability of this wave sampling location requires that the wavelength dependency of the power coupling coefficient of source coupler 12, which will also vary with temperature, not lead to apparent measurement changes in the emission spectrum of source 11 for the feedback control that are too different from the actual changes occurring in that spectrum.

The similar wavelength dependency of the transmission and coupling coefficients of loop coupler 17 do not have any resultant effect on the electromagnetic waves impinging on photodiode 13. Since the counter-propagating electromagnetic waves in coil 10 are each transmitted, in that optical path followed thereby to photodiode 13, both directly through loop coupler 17, and across the coupling region (coupled from the input fiber to the opposite fiber) of that coupler, any wavelength dependent changes in the direct and coupling transmission coefficients are thus balanced against one another.

Ascertaining whether the emission spectrum of source 11 is the major determinant of the spectra of the electromagnetic waves impinging on photodiode 13 can be accomplished by finding a measure of the spectra of those waves impinging on photodiode 13 in terms of the source emission spectrum of source 11. The average spectral frequency $\bar{\nu}_{13}$ at photodiode 13, given in the last expression above, is evaluated in terms of the power emission spectrum of source 11, $P(\nu)_{11}$, by expressing the power spectrum of the electromagnetic waves impinging on photodiode 13 in terms of that source emission spectrum as modified by the effects of the rest of the system in FIG. 1 thereon. The electromagnetic waves leaving source 11 are first transmitted directly through source coupler 12, with a wavelength (or optical frequency) dependent power coupling coefficient $T_{12}(\nu)$, to pass through the remainder of the optical subsystem portion of the system of FIG. 1 past that coupler and return to coupler 12 with power losses enroute through the optical subsystem (including those in source coupler 12) of $\alpha_{oss}(\nu)$ which, as a general matter, are also wavelength dependent. Thereafter, these electromagnetic waves are coupled across the coupling region of source coupler 12 with a power coupling coefficient $C_{12}(\nu)$ to reach photodiode 13. Thus, the power spectrum of the electromagnetic waves reaching photodiode 13 can be written as $$P_{13} = P_{11}(\nu)T_{12}(\nu)[1-\alpha_{oss}(\nu)]C_{12}(\nu).$$

As a result, the average optical frequency of the electromagnetic waves impinging on photodiode 13 can be written as $$\bar{\nu}_{13} = \frac{\int P_{11}(\nu)T_{12}(\nu)[1-\alpha_{oss}(\nu)]C_{12}(\nu)\nu d\nu}{\int P_{11}(\nu)T_{12}(\nu)[1-\alpha_{oss}(\nu)]C_{12}(\nu)d\nu}.$$

Since, as described above, the losses for the optical subsystem in FIG. 1 described above will be relatively small and not very dependent on wavelength (i.e. optical frequency), $\alpha_{oss}(\nu)$ will be both sufficiently small and close to a constant value to have the factors in which it is involved removed from under the corresponding integrals above giving the result $$\bar{\nu}_{13} = \frac{\int P_{11}(\nu)T_{12}(\nu)C_{12}(\nu)\nu d\nu}{\int P_{11}(\nu)T_{12}(\nu)C_{12}(\nu)d\nu}.$$

Considering source coupler 12, there will be, as indicated above, relatively low optical loss therein which will not be very wavelength dependent. In these circumstances, $$T_{12}(\nu) + C_{12}(\nu) = 1.$$

Further, the typical coupling ratio sought will be ½, and so power coupling coefficient $C_{12}(\nu)$ can be more conveniently written as $$C_{12}(\nu) = \tfrac{1}{2} + \delta(\nu)$$

where $\delta(\nu)$ will be a relatively small function indicating the increment or decrement in the value of the power coupling coefficient from ½ as a function of optical frequency. From the last two relations $$T_{12}(\nu) = \tfrac{1}{2} - \delta(\nu).$$

Substituting the values for $T_{12}(\nu)$ and $C_{12}(\nu)$ in terms of incremental function $\delta(\nu)$ into the expression for the average optical frequency $\bar{\nu}_{13}$ at photodiode 13, given in the last expression above, yields $$\bar{\nu}_{13} = \frac{\int P_{11}(\nu)[\tfrac{1}{2}-\delta(\nu)][\tfrac{1}{2}+\delta(\nu)]\nu d\nu}{\int P_{11}(\nu)[\tfrac{1}{2}-\delta(\nu)][\tfrac{1}{2}+\delta(\nu)]d\nu}$$

$$= \frac{\int P_{11}(\nu)[\tfrac{1}{4}-\delta^2(\nu)]\nu d\nu}{\int P_{11}(\nu)[\tfrac{1}{4}-\delta^2(\nu)]d\nu}.$$

Since $\delta(\nu)$ will be a small incremental function for any typical fused optical fiber directional coupler, the square thereof will be negligibly small giving the result $$\bar{\nu}_{13} = \frac{\int P_{11}(\nu)\nu d\nu}{\int P_{11}(\nu)d\nu} \triangleq \bar{\nu}_{11},$$

showing that the average spectral frequency at photodiode 13 in the circumstances described above for the system of FIG. 1 is the same as the average spectral frequency of source 11. Hence, any changes in the source emission spectrum are quite closely matched by changes in the spectra of the electromagnetic waves impinging on photodiode 13 so long as source coupler 12 is chosen to have relatively small changes in its transmission and coupling coefficients over the spectral width of source 11 and the losses in the optical subsystem are sufficiently small or have a sufficiently small wavelength dependence.

Figure 2:
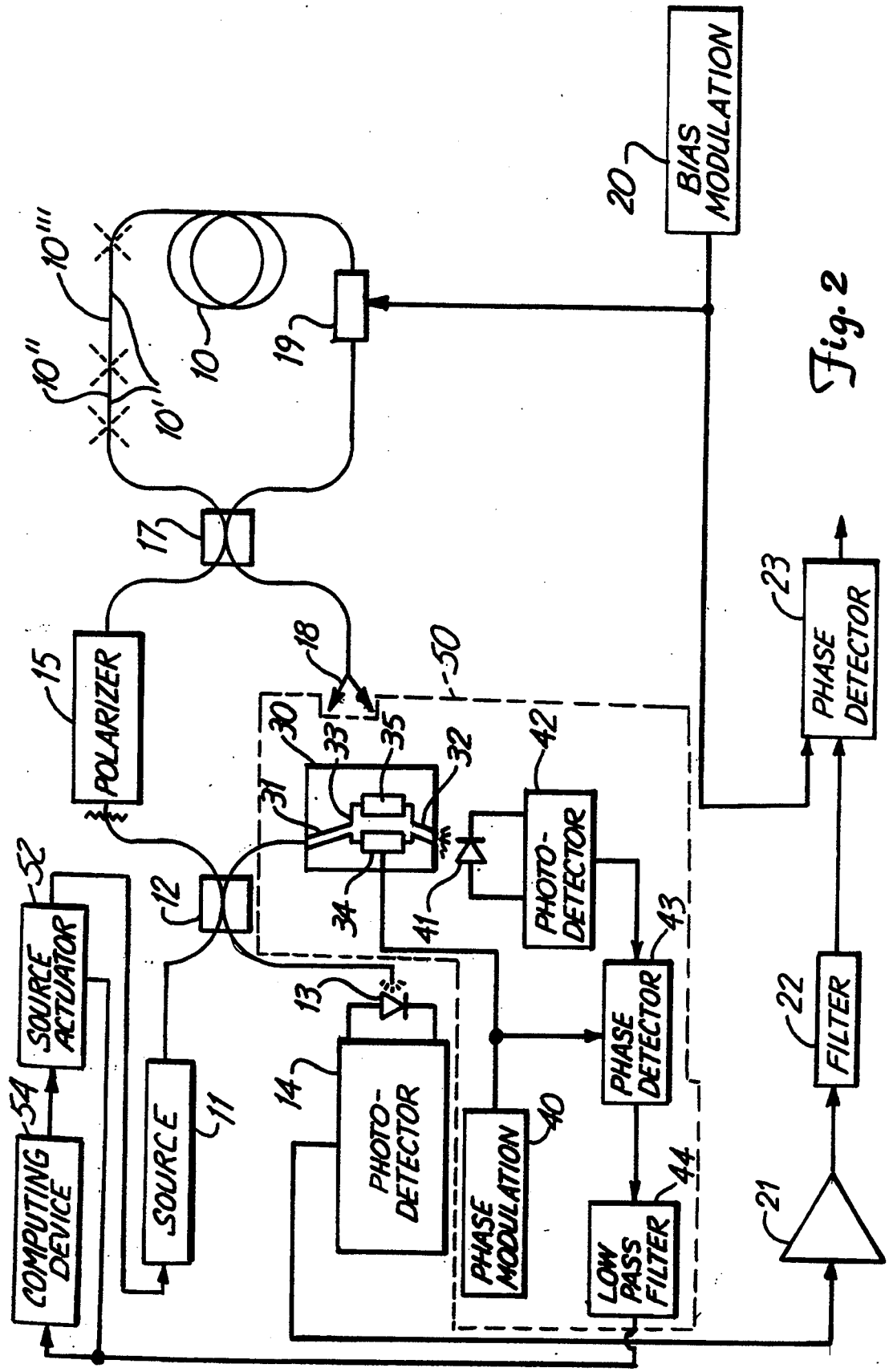
FIG. 2 shows a system schematic diagram combining a signal processing arrangement and an optical transmission path and device arrangement embodying the present invention.

FIG. 2 shows the system of FIG. 1 modified to include an example of the present invention through having a feedback loop for controlling the emission spectrum of source 11. The numerical designations that are used in FIG. 2 that are the same as those used in FIG. 1 are for identical or similar components.

In FIG. 2, the error signal for the feedback loop is taken from the electromagnetic waves provided at nonreflective termination arrangement 16 leading from source coupler 12 in the system shown in FIG. 1 rather than through the addition of a directional coupler between source coupler 12 and photodiode 13 from which the feedback loop added in FIG. 2 could alternatively extend to control the emission spectrum of source 11. Further, as will be described below, an integrated optics chip is shown in the added feedback of the system of FIG. 2, and the use of such an integrated optics chip would also favor integrating other optical subsystem components therein such as polarizer 15, loop coupler 17 and phase modulator 19. In such an embodiment, electromagnetic waves may need to be obtained from near photodiode 13, or from a waveguide "Y" junction provided in this chip, as a basis for controlling the average spectral frequency thereof through controlling the power emission spectrum of source 11.

The integrated optics chip indicated in the previous paragraph to be used in the added feedback loop of FIG. 2 contains at least a phase modulator operating on a double mode waveguide in the chip, such a double mode phase modulator, 30, being used to sense shifts in the spectra of the electromagnetic waves coupled thereto through source coupler 12 from source 11 emitting electromagnetic waves with a source power emission spectrum. An alternative is to use a fiber optic phase modulator based on wrapping a piece of double mode optical fiber about, typically, a cylindrical piezoelectric core or about a piezoelectric disk. Electric signals applied to electrodes on the piezoelectric core or disk stretch the fiber wrapped thereabout to provide the desired phase modulation of the waves propagating through that fiber, and that fiber is capable of supporting two modes therethrough typically by having an elliptical cross section.

The integrated optics chip for double mode phase modulator 30 is typically formed of a SAW grade X-cut and Y-propagating lithium niobate (LiNbO$_3$) crystal substrate having a typical thickness of 1 mm. The waveguides formed therein through a titanium (Ti) diffusion from a major surface thereof. This waveguide is formed by providing a photoresist mask by well known methods on the appropriate surface of the crystal, the mask having openings therein at these locations at which the waveguides are desired. After provision of such a photomask, an electron beam evaporation is performed in a known manner to provide a layer of titanium over both the photomask and the openings therein, and that is followed by using the well-known lift-off process to leave the desired titanium metallization pattern on the crystal surface as a source for a diffusion of titanium into the substrate.

A waveguide capable of supporting propagation of electromagnetic waves therethrough in two modes, or a double mode waveguide, could be formed to extend over the entire distance between two opposite edges of the chip. In such a design, an input optical fiber extending from source coupler 12 abuts one of the ends of the waveguide at a chip edge, but so as to be laterally offset from a symmetrical position, to thereby be used to inject electromagnetic waves into both waveguide modes. An output optical fiber abutting the opposite end of the waveguide at the opposite chip edge, and also laterally offset from a symmetrical position, is used to collect such electromagnetic waves from both modes on the exiting thereof from the chip to provide a wavelength dependent output intensity.

Alternatively, as shown in FIG. 2, however, is the use of a pair of single mode waveguides, 31 and 32, extending in from opposite edges of the chip into the interior thereof to join a double mode waveguide, 33, located between them in the chip (the dimensions of the chip and the waveguides being out of proportion and in some instances greatly exaggerated for purposes of clarity in that figure). Single mode waveguides 31 and 32 are at an angle with respect to the direction of wave propagation in double mode waveguide 33, parallel to the long sides thereof, that angle being approximately four degrees (shown greatly exaggerated in FIG. 2). In this angular input arrangement, incoming electromagnetic waves propagating in a single mode in incoming waveguide 31 are capable of exciting both modes of double mode waveguide 33, and so light from both modes of double mode waveguide 33 is propagated therethrough to be collected by single mode output waveguide 32 due to its angular relationship with waveguide 33.

Input single mode waveguide 31 is shown in FIG. 2 having abutted against it, at the edge of the integrated optics chip in which it is provided, an optical fiber extending from source coupler 12 which ended in non-reflective termination 16 in FIG. 1. In this situation, electromagnetic waves from source 11 are coupled to single mode input waveguide 31 by being coupled through the coupling region of source coupler 12. Alternatively, a second single mode input waveguide, angled oppositely to waveguide 31 from the direction of the long sides of waveguide 33, and similarly a second output waveguide with a similar angular relationship with respect to output waveguide 32, can additionally be provided for testing convenience. A pair of gold electrodes, 34 and 35, are shown on the surface of the lithium niobate crystal partially covering portions of double mode waveguide 33.

Figure 3A:
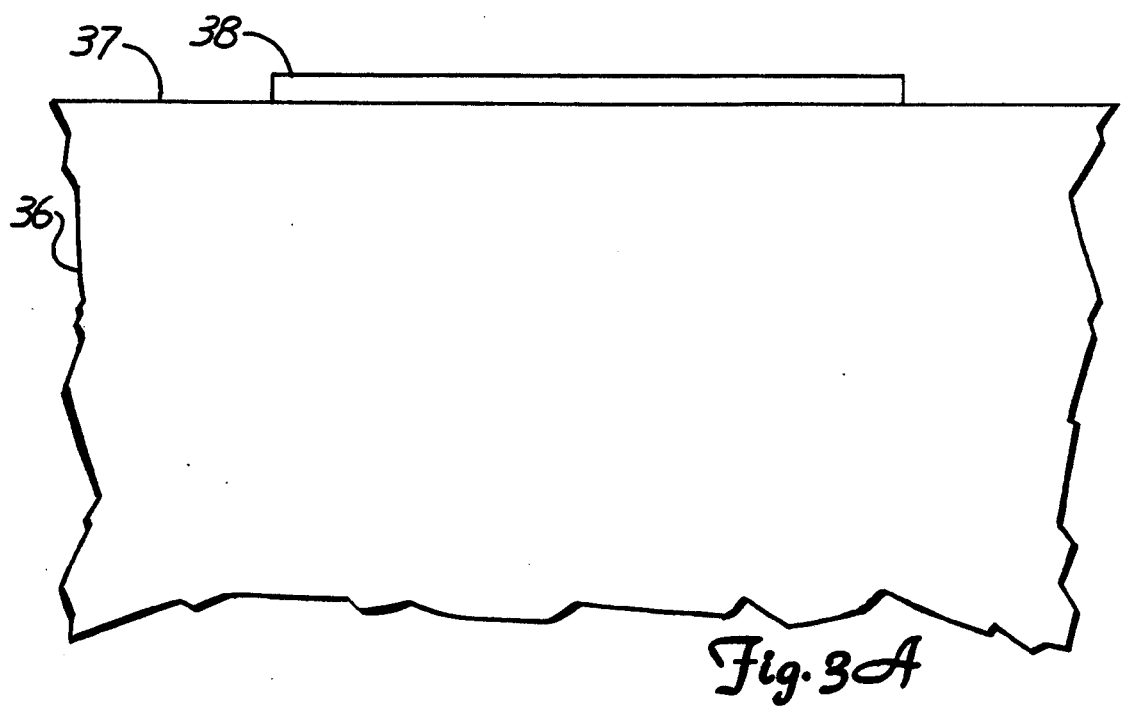
FIGS. 3A and 3B show in cross section view the results of steps in a method for fabricating a portion of an integrated optics chip.

A cross section view of a portion of that substrate, 36, described above as having double mode phase modulator 30 fabricated therein is shown in FIG. 3A. Substrate 36 has an upper surface, 37, on which is shown in cross section the deposited titanium metallization pattern described above, the view being taken where double mode waveguide 33 is to be provided in chip 36. The depth of diffusion of titanium into lithium niobate is not a very sensitive function of the thickness of the titanium metallization pattern on surface 37, but the extent of lateral diffusion is quite dependent on that thickness. Thus, the width of metallization pattern 38 in the cross section view, and the thickness thereof, will be determinative in providing the final diffusion pattern of the titanium in lithium niobate substrate 36 along with the diffusion time and temperature. The extent of the diffusion, and the resulting amount of refractive index change in the diffused region of the substrate caused thereby, will determine the number of electromagnetic wave propagation spatial modes which will be supported by the resulting waveguide.

If the diffusion process for indiffusing the titanium in the metallization pattern is carried out in water vapor (to prevent out-diffusion from substrate 36) at a temperature of 1025° C. for 10 hours, a titanium metallization pattern having a thickness of 750Å and a width of 8 $\mu$m at double mode waveguide 33 permits that waveguide formed therefrom to support propagation of electromagnetic waves therethrough in two spatial modes, a fundamental, or first order, mode and one of the possible second order modes. Reducing the width of titanium metallization pattern 38 to just 5.5 $\mu$m while maintaining the same pattern thickness results in a waveguide under the same diffusion conditions supporting just a fundamental propagation mode, and this is the width used over the portions of substrate 36 where single mode inputs 31 and 32 are to be provided. On the other hand, if the width of titanium metallization pattern 38 over a location intended for double mode waveguide 33 should be increased to 12 $\mu$m, the waveguide which has been found to result will support three propagation modes, an unwanted situation.

Figure 3B:
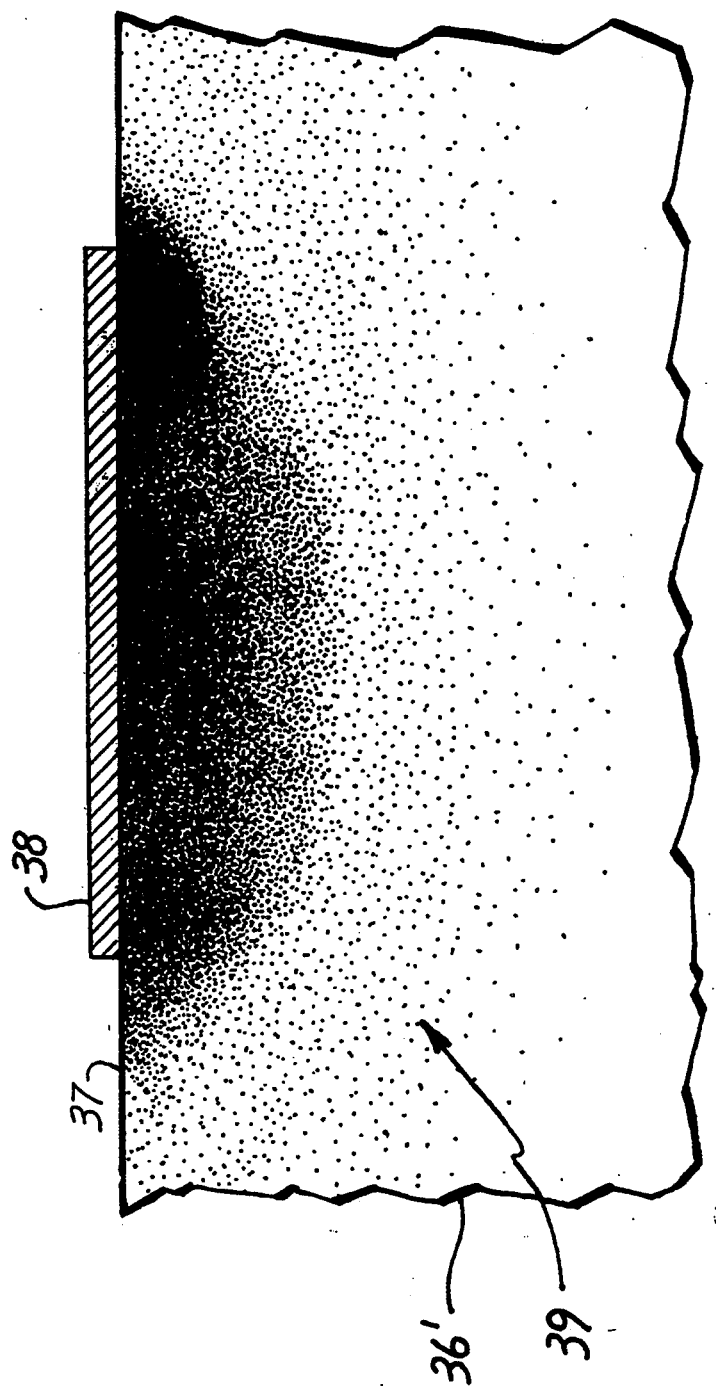

Performing the diffusion of titanium metallization pattern 38 as described above results in a diffusion pattern, 39, in substrate 36 as shown FIG. 3B. As a result, the substrate has been redesignated 36' to recognize the change therein. In addition, approximately the space previously occupied by titanium metallization 38 is now generally occupied by various titanium oxides perhaps to a thickness of 850 Å. These titanium oxides have been redesignated 38' in FIG. 3B.

The refractive index distribution, n(x,y), in substrate 36' resulting from the titanium diffusion can be approximated as $$n(x,y) = n_s + \Delta n f(x) g(y)$$

where $n_s$ is the refractive index of the bulk material in the lithium niobate substrate and $\Delta n$ is the maximum amount of change in the refractive index. The functions f(x) and g(y) describe the distribution function of the refractive index in the x and y directions, respectively, as a result of the diffusion of titanium into the lithium niobate substrate. The values taken by these distribution functions are usually between zero and one. A suitable model for the diffusion result, here radiating outward from a central source on surface 37 of lithium niobate crystal 36, has been found to be $$f(x) = \frac{erf\left[\frac{1}{\sqrt{2} \cdot D_s}\left(x + \frac{W}{2}\right)\right] - erf\left[\frac{1}{\sqrt{2} \, D_s}\left(x - \frac{W}{2}\right)\right]}{2 erf\left[\frac{M}{2\sqrt{2} \, D_s}\right]}$$

where x is the horizontal coordinate in FIG. 3B of substrate 36' having a zero reference at the center of the width of the titanium metallization pattern 38 before diffusion as in FIG. 3A, $D_s$ is the diffusion constant, and W is the metallization width, here 8 μm. The symbol erf has its usual meaning indicating the well-known error function. The distribution in the y direction is a Gaussian function $$g(y) = e^{-\frac{1}{2}(y/D_b)^2}$$

where y is the vertical coordinate in FIG. 3B having a zero reference at surface 37, and $D_b$ is a diffusion constant. Thus, the refractive index distribution n(x,y) provides an approximate description of the waveguide for purposes of determining its spatial mode support capability.

After completion of the diffusion of the titanium metallization pattern, an electrode metallization pattern is provided on surface 37 of lithium niobate substrate 36' through use of well-known photomasking techniques and electron beam evaporation as a basis for forming electrodes 34 and 35. Electrodes 34 and 35 are separated over double mode waveguide 33 from one another symmetrically along the center line of the original titanium metallization 38 parallel to the long sides of that waveguide. The facing edges of electrodes 34 and 35 are separated over double mode waveguide 33 by approximately 4 μm. As a result, the fundamental mode is supported in waveguide 33 primarily between electrodes 34 and 35, while a second order mode is supported to a significant extent under each of electrodes 34 and 35. Electrodes 34 and 35 are provided on a layer of silicon dioxide previously deposited on surface 37 and over titanium oxides 38'. These electrodes typically comprise 100Å of chromium formed on the silicon dioxide surface on substrate 36' with 7,000Å of gold provided covering that chromium. Thereafter, the chip is annealed by heating it to 350° C. for two hours in a water vapor atmosphere.

The waveguides in the integrated optics chip resulting from these processes support propagation of electromagnetic waves therethrough in the various spatial modes possible according to Maxwell's equations, as supplemented by the constitutive equations describing the effect of electromagnetic fields on the material media of the waveguides. The waveguides are graded index waveguides due to the nature of the distribution of the diffusants in substrate 36', but accurate equations for such a situation require numerical solutions because of the resulting complexity. An approximate expression for the behavior of electromagnetic waves in the waveguide can be obtained through considering the waveguide to have an index cross section profile described by n(x,y), and considering the material within the waveguide to be free of any sources of electromagnetic fields by having no currents or free charge therein. The waveguide material is considered to be both isotropic and homogeneous so that any gradients of the permittivity or permeability are considered to have a zero value.

By assuming double mode waveguide 33 to be homogeneous along its length, which will be taken to be along the z axis, the Maxwell equations will be simplified with solutions thereof following the forms $$\vec{E} = \vec{E}(x,y)e^{i(\omega t - \beta z)}$$

$$\vec{H} = \vec{H}(x,y)e^{i(\omega t - \beta z)}$$

With these approximations, the Maxwell equations become $$\nabla_t^2 \vec{E} + (k_o^2 n^2(x,y) - \beta^2)\vec{E} = 0$$

$$\nabla_t^2 \vec{H} + (k_o^2 n^2(x,y) - \beta^2)\vec{H} = 0$$

where the $\nabla_t^2$ is the transverse Laplacian operator, $k_o = \omega/c$ is the wave number, and $\beta$ is the waveguide propagation "constant" to be determined from Maxwell's equations. Applying these equations to the waveguide approximated by n(x,y) leads to mode solutions which are neither pure transverse electric nor pure transverse magnetic modes, but rather two families of hybrid modes. Such hybrid modes are essentially transverse electromagnetic modes polarized along the x and y directions. They are designated TM-like modes and TE-like modes, respectively. The wave equation for the main component of the TM-like mode is $$\frac{\partial^2 E_x}{\partial x^2} + \frac{\partial^2 E_x}{\partial y^2} + k_o^2 n^2(x,y)E_x = \beta^2 E_x,$$

and the equation for the main component of the magnetic field in the TE-like mode is $$\frac{\partial^2 H_x}{\partial x^2} + \frac{\partial^2 H_x}{\partial y^2} + k_o^2 n^2(x,y)H_x = \beta^2 H_x.$$

If these two main components are each represented by the variable $\Phi$, these last two equations can be represented as $$\left(\frac{\partial^2}{\partial x^2} + \frac{\partial^2}{\partial y^2}\right)\Phi(x,y) + k_0^2 n^2(x,y)\Phi(x,y) = \beta^2 \Phi(x,y).$$

In these equations, and n(x,y) is the refractive index distribution function given above.

This last equation can be solved approximately by assuming the solution depending on x and y is separable in these variables, or $$\Phi = Y(x)\psi(y)$$

Figure 4A:
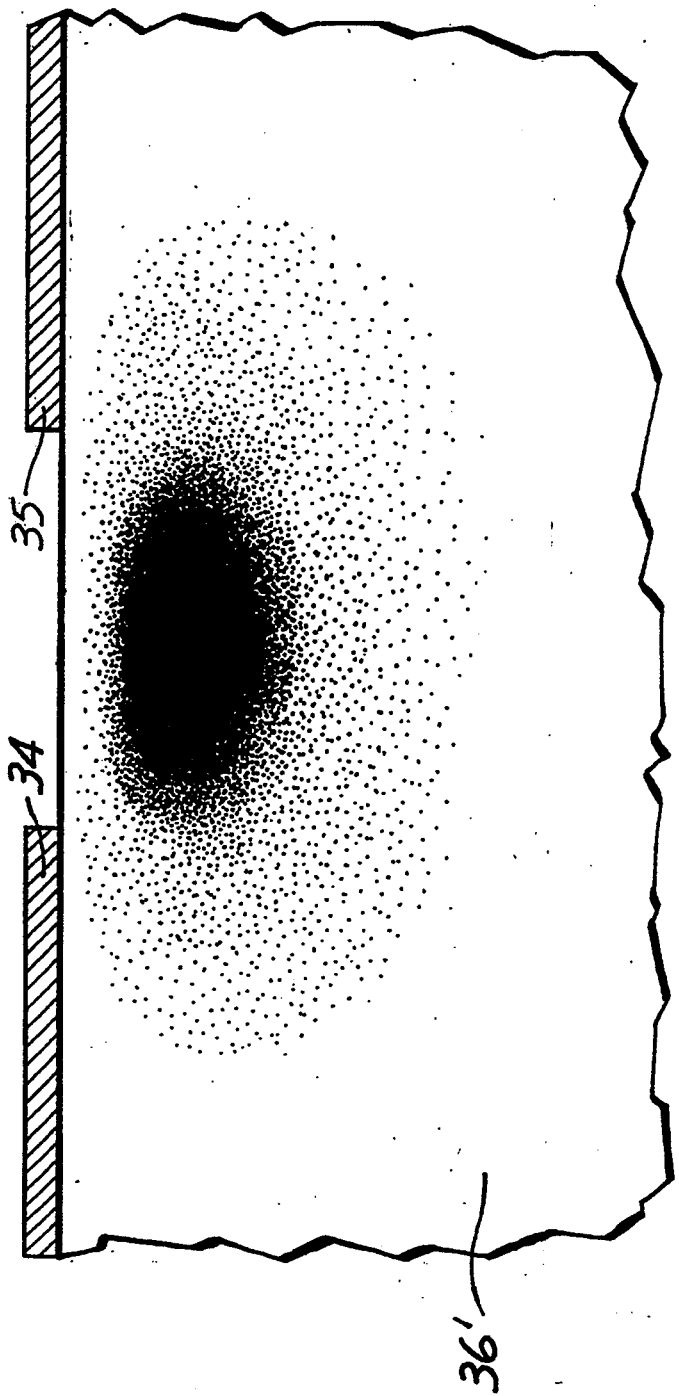

Following known solution methods, an approximate solution for the first mode $\Phi_1$ is found as $$\Phi_1 = \gamma_1(x)\psi_1(y)$$

$$\gamma_1(x) = \frac{1}{\sqrt{\frac{w_1}{2}}\sqrt{\pi}} e^{-\frac{1}{2}(\frac{x}{\frac{w_1}{2}})^2}$$

$$\psi_1(y) = \frac{2}{\sqrt{d_1}\sqrt{\pi}} \frac{y}{d_1} e^{-\frac{1}{2}(\frac{y}{d_1})^2}$$

where $d_1$ is the depth of the mode in substrate 36' and $w_1$ is the width of the mode in substrate 36'. A plot of the distribution of electromagnetic waves in the fundamental mode is shown in FIG. 4A corresponding to this solution. The mode shown is a TE-like mode only because metal electrodes 34 and 35 have the further effect of serving as a waveguide polarizer causing a much larger loss in the TM-like mode than they cause in the TE-like mode. The silicon dioxide layer and the chromium layer, described above as being under electrodes 34 and 35, are not separately shown in FIG. 4A.

Similarly, for the second mode having the solution $$\Phi_2 = \gamma_2(x)\psi_2(y)$$

$$\gamma_2(x) = \frac{2}{\sqrt{w_2\sqrt{\pi}}} \frac{x}{w_2} e^{-\frac{1}{2}(\frac{x}{w_2})^2}$$

$$\psi_2(y) = \frac{2}{\sqrt{d_2\sqrt{\pi}}} \frac{y}{d_2} e^{-\frac{1}{2}(\frac{y}{d_2})^2}$$

where $d_2$ is again the mode depth for this mode and $w_2$ is the mode width. The second order TE-like mode is shown in FIG. 4B, again without showing the separate layers of silicon dioxide and chromium under electrodes 34 and 35.

Note that the fundamental mode shown in FIG. 4A is positioned in lithium niobate substrate 36' symmetrically and essentially between electrodes 34 and 35. In contrast, the two lobes of the second order mode in lithium niobate substrate 36' shown in FIG. 4B have half of the left-hand lobe positioned beneath electrode 34 with only the remaining half being in the waveguide between these two electrodes. The right-hand lobe of the second order mode is positioned in the same way with respect to electrode 35.

The electric fields established by electrodes 34 and 35 when electrically energized are significantly stronger in the portion of lithium niobate substrate 36' located between electrodes 34 and 35 than the field is in the portions of that substrate beneath those electrodes. As a result, the effective refractive index in the waveguide supporting these two modes will be varied significantly more in the region in which electromagnetic waves propagate in the fundamental mode than will the effective refractive index in the regions in which electromagnetic waves propagate in the second order mode. Thus, in a given electrical energization of electrodes 34 and 35, electromagnetic waves propagating in the fundamental mode will be phase modulated to a relatively greater extent than those propagating in the second order mode.

In addition, solutions for the propagation "constant" for each mode are found as $$\beta_1 = n_{eff1}k_o = (n_s \Delta n_{eff1})k_o$$

$$\beta_2 = n_{eff2}k_o = (n_s \Delta n_{eff2})k_o,$$

where $\Delta n_{eff1}$ and $\Delta n_{eff2}$ are the effective changes in the refractive indices which are obtained in the solution and depend in a complicated fashion on the mode depths, the mode widths, the diffusion constants and wavelength. The total output intensity, $I_{DM}$, from double mode waveguide 33 in double mode phase modulator 30 for an input intensity $I_o$ to the two spatial propagation modes due to the combining of the resulting output intensities of both modes in propagating through the effective refractive indices changes due to the diffusion in substrate 36' is subsequently found to be $$I_{DM} = (E_1 + E_2)^2 = \frac{I_o}{2}\left\{1 + \cos\left[\frac{2\pi}{\lambda}(\Delta n_{eff1} - \Delta n_{eff2})L\right]\right\}$$

-continued $$\approx \frac{I_o}{2}\left\{1 + \cos\left[2\pi L\left(\frac{\Delta r}{\lambda} + \Delta s\lambda\right)\right]\right\},$$

for the approximate solutions $$\Delta n_{eff1} \approx r_1 + s_1\lambda^2$$

$$\Delta n_{eff2} \approx r_2 + s_2\lambda^2$$

defining $$\Delta r \triangleq r_1 - r_2$$

$$\Delta s \triangleq s_1 - s_2.$$

Here, $r_1$, $r_2$, $s_1$ and $s_2$ are constants in truncated Taylor's series approximations of $\Delta n_{eff1}$ and $\Delta n_{eff2}$ with these constants depending on the mode depths, the mode widths and the diffusion constants, and L is the length of double mode waveguide 33. Clearly, the output electromagnetic wave intensity of double mode waveguide 33 depends on the wavelength, or optical frequency, of the waves propagating therethrough in the two modes present, and thus is a measure of the wavelength, or optical frequency, of the waves entering that waveguide. This dependence of intensity on wavelength occurs because of the differences between the group velocities of the electromagnetic waves propagating in the two modes leading to interference between those waves on being recombined.

The argument of the cosine function in the output intensity expression above equals the total phase difference over the length of the double mode waveguide between, or the differential propagation "constant" $\Delta\beta(\nu)$ times the waveguide length for, the two modes propagating in double mode waveguide 33, or $$\Delta\beta(\nu) = 2\pi\left(\frac{\Delta r}{\lambda} + \Delta s\lambda\right)$$

$$= 2\pi\left(\frac{\Delta r\nu}{c} + \frac{\Delta sc}{\nu}\right)$$

using $\lambda = c/\nu$. Double mode waveguide 33 is sufficiently short that $\Delta\beta(\nu)L$ does not vary too greatly over the extent of the emission spectrum of source 11. A plot of this differential propagation "constant" versus optical frequency output characteristic is shown in FIG. 5.

Figure 5:
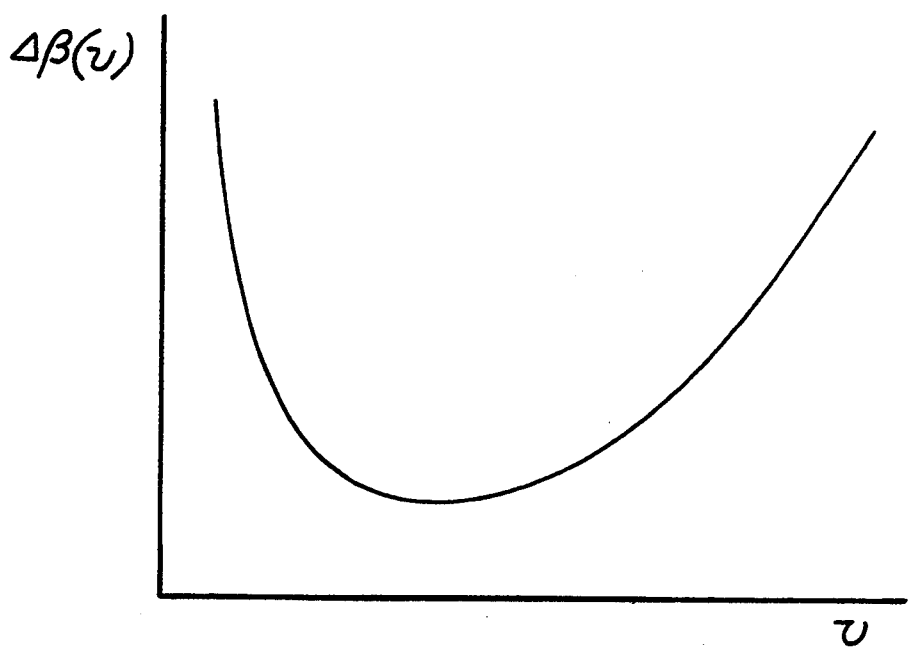
FIG. 5 shows a graph of an output characteristic of a port]on of an integrated optics chip.

FIG. 5 shows that there is a small range about a point in the differential propagation "constant" versus optical frequency output characteristic at which the differential propagation "constant", and so the output wave intensity, of double mode waveguide 33 has very little dependence on the optical frequency, or wavelength, of those electromagnetic waves propagating through that waveguide. Such a characteristic is found because of the refractive index distribution in substrate 36' resulting from the diffusion process used in which there is a single central diffusion source on a surface of the waveguide. The minimum point in the plot of FIG. 5 is the optical frequency where the group velocities of the waves in both modes are equal. Since the control of the average spectral frequency of the emission spectrum of source 11 is to depend on measuring shifts in the spectral distribution thereof, the wavelength of that source and the structure of double mode waveguide 33 must not be chosen such that operation of the added feedback loop in the system of FIG. 2 with source 11 can occur at optical frequencies in the trough of the output characteristic of double mode phase modulator 30 shown in FIG. 5.

A phase modulation generator, 40, has an output thereof electrically connected to electrode 34 with electrode 35 being electrically connected to ground potential. The voltage signal at the output of phase modulation generator 40 operates double mode phase modulator 30 to phase modulate those electromagnetic waves in both modes propagating through double mode waveguide 33 subsequent to the emission thereof by source 11 to reach that waveguide by propagating through source coupler 12. This phase modulation of the polarized waves in double mode waveguide 33 occurs at the frequency of the output voltage of generator 40 in a well known manner through the electrooptic effect in the LiNbO$_3$ material of substrate 36'. Phase modulation generator 40 provides a sinusoidal output signal at a frequency typically around 1 kHz, a value which is not harmonically related to any of the operating frequencies used elsewhere in the system of FIG. 2, such as frequency to bias modulation generator 20, to avoid introducing noise into that system and to avoid noise in this additional feedback loop in FIG. 2.

Electromagnetic waves exit from double mode waveguide 33 through output waveguide 32 in substrate 36' to impinge on a feedback loop photodetector, 41, such as a photodiode having its junction region abutted against output waveguide 32 at the edge of the integrated optics chip so that these electromagnetic waves, having an intensity $I_{DM}$, can be converted to corresponding photocurrents thereby. Output waveguide 32 is, as indicated above, at a 4° angle to the longer axis of symmetry of double mode waveguide 33, substantially parallel to the mode propagation paths, so that electromagnetic waves from both modes combine to propagate in that output waveguide. Photodiode 41 is typically a p-i-n photodiode which is connected to and operated by a bias and amplifying circuit, 42.

Photodiode 41 thus provides an output current, $I_{PD41}$ proportional to the intensity of the electromagnetic waves impinging thereon in combination from each of the modes such that the waves from each mode can interfere with one another, and is therefore expected to provide a current following the cosine of the phase difference between the waves in these two modes impinging on that diode, or $$I_{PD41} = \int a C_{12}(\nu) P_{11}(\nu)\{1 + \cos[\Delta\beta(\nu)L + \Delta\phi_m \cos\omega_m t]\}d\nu,$$

where the symbol a represents the coupler and chip propagation losses, and the chip interface losses, all taken to be independent of wavelength, and $\Delta\beta(\nu)$ is as given in the previous expression. The symbol $\Delta\phi_m$ represents the difference in modulation depth between the fundamental and second order modes propagating in double mode waveguide 33 and, although having a slight wavelength dependence, that dependence is ignored here in taking this parameter as a constant. This photocurrent in circuit 42 is typically amplified and converted to an equivalent voltage, $v_{42}$, given by $$v_{42} = \int a'C_{12}(\nu)P_{11}(\nu)d\nu +$$

-continued
$$\int a'C_{12}(\nu)P_{11}(\nu)\cos[\Delta\beta(\nu)L]\cos(\Delta\phi_m \cos\omega_m t)d\nu -$$

$$\int a'C_{12}(\nu)P_{11}(\nu)\sin[\Delta\beta(\nu)L]\sin(\Delta\phi_m \cos\omega_m t)d\nu,$$

after expansion and the use of a trigonometric identity. The new symbol a' is equal to the value of the constant a multiplied by the conversion and amplification factors introduced by circuit 42, these factors taken as being constants over optical frequency or wavelength.

The voltage output signal from photodetector 42 is supplied to the signal input of a phase detector, 43, which is formed by a phase sensitive detector or lock-in amplifier. The demodulation input of phase sensitive detector 43 also receives the output signal of phase modulation generator 40 for demodulation purposes. As a result, photodetector output voltage $v_{42}$ is demodulated to select the first harmonic therefrom which is provided at the output of photodetector 43 and transmitted to a low pass filter, 44, having its cutoff frequency at a value substantially less than the frequency value $f_m$ of the first harmonic, or $f_m = \omega m/2\pi$. Thus, the amplitude of photodetector output voltage signal $v_{42}$ at frequency $f_m$ is provided at the output of lowpass filter 44 as filter output voltage signal $v_{44}$. Double mode phase modulator 30, phase modulation generator 40, feedback loop photodiode 41, photodetector bias and amplifying circuit 42, phase detector 43 and low pass filter 44 constitute a system spectrum determination means 50.

Signal $v_{44}$ can be found by expanding the expression for photodetector output signal $v_{42}$ through the use of a series of Bessel functions in a well known manner. Such an expansion leads to finding the first harmonic signal at the output of lowpass filter 44 as $$v_{44} = -a'J_1(\Delta\phi_m)\int C_{12}(\nu)P_{11}(\nu)\sin[\Delta\beta(\nu)L]d\nu$$

where $J_1(\Delta\phi_m)$ is a first order Bessel function. This signal $v_{44}$, then, is the error signal applied to source 11, via a source actuator means 52, to control the position over wavelength, or optical frequency, of the emission spectrum of the laser therein for the electromagnetic waves emitted thereby for introduction into source coupler 12.

Such an error signal is used to operate the laser in source 11 to shift its emission spectrum to have the average wavelength that it had at the last calibration of the feedback loop from other average values it may have since come to have in the face of various changes experienced by that laser. One means for doing so would be to allow the error signal $v_{44}$ to control the electrical current through the laser in source 11 which has an effect on the emission spectrum thereof, but also has an even greater effect on the intensity of the output electromagnetic waves, via source actuator 52. Further, such an operation of the laser usually involves high currents therethrough leading to high laser temperatures. In such a current controlled laser, source 11 would have an appropriate current controller therein responding to the direction of $v_{44}$.

The laser emission spectrum is much more sensitive to the laser temperature, and that temperature may be controlled directly by control signal $v_{44}$ as an alternative means of control of the emission spectrum of the laser. This can be accomplished by placing a resistive heating strip about the laser in source 11, or by running the laser at a high temperature and placing a Peltier or thermoelectric cooler thereagainst. A temperature controller is used in source 11 to operate such elements, the controller being directed by signal $v_{44}$. The intensity of the output electromagnetic waves of the laser also depend to a degree on the temperature of that laser. Further, there may have to be stabilization measures taken in the added feedback loop in the system of FIG. 2 due to the response delays in heating or cooling elements, and in the immediate surroundings thereof, to changes in signal $v_{44}$.

Finally, the alignment of the electromagnetic wave emitting surface of the laser in source 11 and the optical fiber extending therefrom to source coupler 12 determines in part the wavelength of the electromagnetic waves actually inserted into that optical fiber for transmission into the system. Alignment changes can be made under the direction of control signal $v_{44}$ operating a piezoelectric motor in source 11 capable of changing the angular relationship between the laser emitting surface in source 11 and the optical fiber extending therefrom. Again, the alignment will also have an effect on the intensity of the electromagnetic waves inserted into that optical fiber.

Thus, source 11, under the direction of the control signal provided as error signal $v_{44}$, can accordingly change the wavelengths or optical frequencies over which occurs the emission spectrum of the electromagnetic waves emitted by the laser in source 11 for insertion into the optical fiber leading to source coupler 12. In doing so, such control typically also affects the intensity of these electromagnetic waves. Due to the sensitivity of the alignment control, use of alignment control in conjunction with either temperature control or current control can result in obtaining the best combination of controlling both the intensity and the emission spectrum of the electromagnetic waves emitted by the laser in source 11 for such insertion. A computing means 54, or system intensity determination means 54, in source 11, or a computing means 54, used elsewhere with systems incorporating the system of FIG. 2 and used in connection with source 11 and source actuator 52, can be used to determine an angular relationship between the laser and the optical fiber extending therefrom, and either a temperature value or a value for the current through the laser, to provide the best result for the wave intensity and spectrum relative to some desired values therefor.

Whatever actuation arrangement is chosen to give effect to error signal $v_{44}$ in controlling the location over wavelength or optical frequency of the emission spectrum of the laser in source 11, a proper use of that signal in the controller and actuator of source 11 leads to counteracting changes in and about the laser of source 11 from the calibration values. Thus, the overall effect of the negative feedback loop extending from source 11 through source coupler 12, double mode phase modulator 30, photodiode 41, photodetector circuitry 42, phase detector 43 and lowpass filter 44, and back to source 11, is to cause such changes in location of the emission spectrum of source 11 over wavelength as are necessary to force the error signal toward zero value. That is, in a steady state situation, $v_{44}$ will be equal to zero. This results in the integral in the expression for $v_{44}$ being forced to zero or $$t_i \int C_{12}(v) P_{11}(v) \sin[\Delta\beta(v)L] d\Gamma = 0$$

As indicated above, $\Delta\beta(v)$ varies relatively little over the emission spectrum of source 11, and so the sine function under this last integral, in which $\Delta\beta(v)$ appears as part of the argument, will also vary relatively little from some value of that argument for which that function is zero. This sine function must be zero in the steady state at least for this last integral equation to hold since neither $C_{12}(v)$ nor $P_{11}(v)$ can be zero. Thus, a reasonable approximation for $\Delta\beta(v)L$ is $$\Delta\beta(v)L\big|_{v-\bar{v}+\Delta v} \approx \Delta\beta(v)L\big|_{v-\bar{v}} + \frac{\partial\Delta\beta(v)}{\partial v}\bigg|_{v-\bar{v}} L\Delta v$$

$$\approx n\pi + \frac{\partial\Delta\beta(v)}{\partial v}\bigg|_{v-\bar{v}} L\Delta v$$

where $\Delta\beta(v)L$ at the average optical frequency is taken to be $n\pi$ so the last integral equation can be satisfied in the steady state. Using this result in the sine function under the integral yields $$\sin[\Delta\beta(v)L] =$$

$$\pm\left\{\frac{\partial\Delta\beta(v)}{\partial v}\bigg|_{v-\bar{v}} L\Delta v - \frac{1}{6}\left[\frac{\partial\beta(v)}{\partial v}\bigg|_{v-\bar{v}} L\Delta v\right]^3 + \ldots\right\}$$

as a further series expansion to approximate that sine function about the average optical frequency $\bar{v}$ using trigonometric identity and small angle approximations. As a result, the last integral equation above can be written $$\frac{\partial\Delta\beta(v)}{\partial v}\bigg|_{v-\bar{v}} L \int C_{12}(\bar{v} + \Delta v) P_{11}(\bar{v} + \Delta v) \times$$

$$\left\{\Delta v - \frac{1}{6}\left[\frac{\partial\Delta\beta(v)}{\partial v}\bigg|_{v-\bar{v}} L\right]^2 (\Delta v)^3\right\} d\Delta v = 0.$$

This last integral equation makes clear that $$\frac{\partial\Delta\beta(v)}{\partial v}\bigg|_{v-\bar{v}} \neq 0,$$

or there will be no dependence on optical frequency excursions $\Delta v$ required to satisfy this last equation, and so no control signal dependent on such excursions to control the location of the emission spectrum of source 11. As indicated above in connection with the description of double mode phase modulator 30 output characteristic in FIG. 5, double mode waveguide 33 can indeed be designed with a given average optical frequency for source 11 such that the foregoing partial derivative will be at or very near zero (near the bottom of the trough in that figure), a situation which must be avoided.

Assuming that the design is such that this partial derivative does not equal zero, the condition of the last integral becomes $$\int C_{12}(\bar{v} + \Delta v) P_{11}(\bar{v} +$$

$$\Delta v)\left\{\Delta v - \frac{1}{6}\left[\frac{\partial\Delta\beta(v)}{\partial v}\bigg|_{v-\bar{v}} L\right]^2 (\Delta v)^3\right\} d\Delta v = 0,$$

a condition which effectively defines the value of the average optical frequency $\bar{\nu}$. The higher order term in the braces, the third order term, will be negligible if $\Delta\beta\nu L$ does not vary much over the emission spectrum of source 11, a situation already indicated above to be expected. In addition, if the emission spectrum of source 11 is symmetrical in respect to the average optical frequency $\bar{\nu}$, the third order term will add nothing to the value of the integral even if of a significant value. Since both of these situations are expected to occur, neglecting the third order term under the integral in the last integral equation is fully justified. Even if there were residual errors existing because these two conditions were not fully met, such errors will probably remain stable over time since the source spectrum, although shifting over time, tends to preserve the same shape over the optical frequency axis. Hence, any initial calibration of the system will balance out such errors and this balancing will be sufficient over time in view of the perseverance of the emission spectrum shape.

Neglecting such higher order term results in the integral equation becoming $$\int C_{12}(\bar{\nu}+\Delta\nu)P_{11}(\bar{\nu}+\Delta\nu)\Delta\nu d\Delta\nu = 0.$$

Changing variables through substituting $\nu=\bar{\nu}+\Delta\nu$ yields $$\int C_{12}(\nu)P_{11}(\nu)(\nu-\bar{\nu})d\nu = 0 = \int C_{12}(\nu)P_{11}(\nu)\nu d\nu - \bar{\nu}\int C_{12}(\nu)P_{11}(\nu)d\nu$$

after splitting the integral into two integrals. This gives the result $$\bar{\nu}_c = \frac{\int C_{12}(\nu)P_{11}(\nu)\nu d\nu}{\int C_{12}(\nu)P_{11}(\nu)d\nu}.$$

Here, $\nu_c$ has been substituted for $\bar{\nu}$. This substitution has been made as this is the average value of the optical frequency that is actually maintained by the feedback loop added in FIG. 2, i.e. the controlled value of the average optical frequency of the emission spectrum of the electromagnetic waves emitted by the laser in source 11.

One further condition which must be observed to successfully implement the feedback loop added in the system of FIG. 2 to control the location of the emission spectrum of source 11 over wavelength is to observe the electromagnetic wave polarization consistency necessary for that loop. As described above, double mode phase modulator 30 effectively provides an output signal for only one of the two possible polarization states of the electromagnetic waves entering input waveguide 31. In a gyroscope system using polarization-maintaining optical fiber, the principal birefringent axis of the optical fiber abutting input waveguide 31 that is aligned with that axis of double mode phase modulator 30 permitting the corresponding polarization state to propagate therethrough should be the same fiber principal birefringent axis aligned with the one of the uncorrelated emission axes of the laser in source 11 which is primarily providing the emitted electromagnetic waves with that polarization state. Otherwise, the feedback loop would be measuring waves in one polarization and attempting to use the resulting information to control the electromagnetic waves in the opposite polarization state, an unstable situation which would often be the source of substantial error. In some situations, to assure sufficient blocking of the polarization mode expected to be blocked by double mode phase modulator 30, a polarizer may have to be added to the feedback loop containing that element for the purpose of keeping errors sufficiently small.

In a gyroscope system using depolarizer 10' with coil 10, some versions can have source coupler 12 formed of ordinary single mode optical fiber, or have a further depolarizer therein positioned ahead of coupler 12, or both. As a result, the polarizations states emitted along the uncorrelated emission axes of the laser in source 11 will be mixed on reaching double mode phase modulator 30, and a part of that mix will be propagated along the pass axis thereof. Thus, the added feedback loop in the system of FIG. 2 will in effect control an average of the wavelengths in the polarization state used in controlling of the average optical frequency of source 11, an average that will change over time as conditions change. Some variation in this average optical frequency with changing conditions will be the result.

The same situation with respect to the wavelength average in the signal reaching photodiode 13 will also result because of depolarizer 10' mixing polarization states. This result will limit scale factor constancy and so give rise to variation therein as conditions change leading to error in the gyroscope output signal. In this output signal situation, an additional directional coupler between source coupler 12 and photodiode 13 is likely to be needed so that waves enroute to that diode can be sampled as the basis for controlling the optical frequency of source 11, this added coupler avoiding such changing average effects occurring in the remainder of the system to thereby permit satisfactory control.

As can be seen from the equation for $\bar{\nu}_c$, maintaining the average optical frequency $\bar{\nu}_c$ would be the same thing as maintaining the average optical frequency $\bar{\nu}_{11}$ given above if $C(\nu)$ remains constant. As already shown above, maintaining the average spectral frequency $\bar{\nu}_{11}$ at a selected value has the effect of maintaining the average optical frequency $\bar{\nu}_{13}$ of the waves impinging on photodiode 13 at a corresponding value to thereby provide a constant gyroscope scale factor. However, since the coupling coefficient $C_{12}(\nu)$ can change with wavelength, and with other variables such as temperature though not indicated explicitly in the argument, its value can become $C_{12}(\nu)+\Delta C_{12}(\nu)$. This occurrence thereby forces $P_{11}(\nu)$ to $P_{11}(\nu)+\Delta P_{11}(\nu)$ because of the action of the added feedback loop in the system of FIG. 2, and with the further result that $\bar{\nu}_{11}$ can be forced to $\bar{\nu}_{11}+\Delta\bar{\nu}_{11}$.

In the situation of such a change in the coupling coefficient of source coupler 12, the average optical frequency $\bar{\nu}_c$ maintained by the additional feedback loop in the system of FIG. 2 becomes $$\bar{\nu}_c = \frac{\int C_{12}(\nu)P_{11}(\nu)\nu d\nu}{\int C_{12}(\nu)P_{11}(\nu)d\nu} \equiv$$

$$\frac{\int [C_{12}(\nu)+\Delta C_{12}(\nu)][P_{11}(\nu)+\Delta P_{11}(\nu)]\nu d\nu}{\int [C_{12}(\nu)+\Delta C_{12}(\nu)][P_{11}(\nu)+\Delta P_{11}(\nu)]d\nu} =$$

$$[\int C_{12}(\nu)P_{11}(\nu)\nu d\nu + \int C_{12}(\nu)\Delta P_{11}(\nu)\nu d\nu +$$

$$\int \Delta C_{12}(\nu)P_{11}(\nu)\nu d\nu + \int \Delta C_{12}(\nu)\Delta P_{11}(\nu)] \times$$

$$\left\{ \int C_{12}(\nu)P_{11}(\nu)d\nu \left[ 1 + \frac{\int \Delta C_{12}(\nu)P_{11}(\nu)d\nu}{\int C_{12}(\nu)P_{11}(\nu)d\nu} + \right. \right.$$

$$\left. \frac{\int C_{12}(v)\Delta P_{11}(v)dv}{\int C_{12}(v)P_{11}(v)dv} + \frac{\int \Delta C_{12}(v)\Delta P_{11}(v)dv}{\int C_{12}(v)P_{11}(v)dv} \right]\right\}^{-1}.$$

Algebraic manipulation, reciprocal binomial approximation, and keeping only terms of first order in the incremental variables yields $$\int C_{12}(v)\Delta P_{11}(v)vdv + \int \Delta C_{12}(v)P_{11}(v)vdv = [\int \Delta C_{12}(v)P_{11}(v)dv + \int C_{12}(v)P_{11}(v)dv]\bar{v}_c.$$

If the coupling coefficient reference state $C_{12}(v)$ with respect to which the changes $\Delta C_{12}(v)$ occur has a value of one-half as is typical (following the expression $C_{12}(v) = \frac{1}{2} + \delta(v)$ used above), this last expression becomes $$\tfrac{1}{2}\int \Delta P_{11}(v)vdv + \int \Delta C_{12}(v)P_{11}(v)vdv = [\int \Delta C_{12}(v)P_{11}(v)dv + \tfrac{1}{2}\int \Delta P_{11}(v)dv]\bar{v}_c.$$

The average optical frequency of the emission spectrum of source 11, given above as $$\bar{v}_{11} = \frac{\int P_{11}(v)vdv}{\int P_{11}(v)dv},$$

can change, because of the change in the source coupler coefficient as indicated above, to $$\bar{v}_{11} + \Delta\bar{v}_{11} = \frac{\int [P_{11}(v) + \Delta P_{11}(v)]vdv}{\int [P_{11}(v) + \Delta P_{11}(v)]dv}$$
$$= \frac{\int P_{11}(v)vdv + \int \Delta P_{11}(v)vdv}{\int P_{11}(v)dv \left[1 + \frac{\int \Delta P_{11}(v)dv}{\int P_{11}(v)dv}\right]}.$$

Again, algebraic manipulation, approximation and keeping only terms to the first order in the incremental variables, provides $$\Delta\bar{v}_{11} \approx \frac{\int \Delta P_{11}(v)vdv}{\int P_{11}(v)dv} - \frac{\int \Delta P_{11}(v)dv}{\int P_{11}(v)dv}\bar{v}_{11}.$$

Substituting for the numerator of the first term on the right the value found therefor in the last equation above involving the control frequency $\bar{v}_c$ yields $$\Delta\bar{v}_{11} \approx \frac{-2\int \Delta C_{12}(v)P_{11}(v)vdv}{\int P_{11}(v)dv} +$$
$$\frac{[2\int \Delta C_{12}(v)P_{11}(v)dv + \int \Delta P_{11}(v)dv]\bar{v}_c - [\int \Delta P_{11}(v)dv]\bar{v}_{11}}{\int P_{11}(v)dv}.$$

Noting that the average optical frequency of source 11 can be written in terms of the control frequency as $$\bar{v}_{11} = \bar{v}_c + \Delta\bar{v}_{fd}$$

where $\Delta\bar{v}_{fd}$ is the relatively small frequency difference which may occur because of source coupler parameter changes between the average optical frequency which the feedback loop is controlling and the average optical frequency of the emission spectrum of source 11, substituting this relationship for $v_c$ in the preceding equation gives the result $$\Delta\bar{v}_{11} = \frac{-2\int \Delta C_{12}(v)P_{11}(v)vdv}{\int P_{11}(v)dv} + \frac{2\int \Delta C_{12}(v)P_{11}(v)dv}{\int P_{11}(v)dv}\bar{v}_{11}$$
$$= 2\frac{\int \Delta C_{12}(v)P_{11}(v)(\bar{v}_{11} - v)dv}{\int P_{11}(v)dv}$$

where again terms which are not first order in the incremental variables are neglected.

Considering the first of these last two equations for $\Delta\bar{v}_{11}$ having two terms on the right, any change in the coupling coefficient of source coupler 12 $\Delta C_{12}$ which is wavelength independent allows that coefficient to be taken out from underneath the integrals in that equation, or $$\Delta\bar{v}_{11} = \frac{-2\Delta C_{12}\int P_{11}(v)vdv}{\int P_{11}(v)dv} + \frac{2\Delta C_{12}\int P_{11}(v)dv}{\int P_{11}(v)dv}\bar{v}_{11}.$$

Then, in using the definition above for $v_{11}$, the result is reached $$\Delta\bar{v}_{11} = -2\Delta C_{12}\bar{v}_{11} + 2\Delta C_{12}\bar{v}_{11}$$
$$= 0.$$

Hence, changes in the coupling coefficient represented by $\Delta C_{12}$ which are not optical frequency, or wavelength, dependent lead to no change in the average optical frequency of source 11.

Such wavelength independent changes in the coupling coefficient typically come about because of temperature changes which in fact change the coupling coefficient, but do so in a manner which leaves the spectrum of the electromagnetic waves coupled therethrough unchanged. Typically, fused couplers will behave in just this manner, that is, the coupling coefficient therein changes with temperature but without the change being wavelength dependent. Such a typical fused coupler, then, has to the first order no effect on the operation of the added feedback loop in the system of FIG. 2. Further, any frequency dependence of the coupling coefficient is quite likely to be very small if it occurs so that the factor $(\bar{v}_{11} - v)$ will also be quite small leaving any change in the source spectrum average optical frequency $\Delta\bar{v}_{11}$ also quite small.

In addition to source coupler 12, there is a further component in the added feedback loop in the system of FIG. 2 in which ambient temperature changes will cause performance changes, that component being double mode phase modulator 30. Although the changes in temperature at ambient will not lead to any redistribution of the titanium diffusant in substrate 36', and thus no change in the refractive index profile in that substrate with temperature, there will nevertheless be a temperature dependence in the phase difference between electromagnetic waves in the two modes supported in double mode waveguide 33. Because lithium niobate crystal 36' will undergo dimensional changes with temperature, the resulting waveguide therein will also have dimensional changes with temperature. Further, residual strains from the diffusion process will also respond to temperature changes since there will be slightly different temperature coefficients in the waveguide portion of crystal 36' relative to the rest of that crystal. Thus, the total phase difference between electromagnetic waves propagating in each of the modes is more fully expressed as a function also of temperature, or $$\Delta\beta(\nu,T)L = 2\pi\left[\frac{\Delta r(T)\nu}{c} + \frac{\Delta s(T)c}{\nu}\right]$$

The effect of interchanges in double mode phase modulator 30 on the behavior of the added feedback loop of the system of FIG. 2 are determined from the equation found above governing the behavior of that feedback loop, or $$\int C_{12}(\nu)P_{11}(\nu)\sin[\Delta\beta(\nu)L]d\nu = 0$$

The change in total phase difference between the electromagnetic waves propagating in each of the modes $\Delta\beta(\nu,T)L$ again can be approximated in a series expansion as $$\Delta\beta(\nu,T)L|_{T=T_0+\Delta T} \approx$$

$$\Delta\beta(\nu,T)L|_{T=T_0} + \frac{\partial[\Delta\beta(\nu,T)L]}{\partial T}\bigg|_{T=T_0}\Delta T$$

Then, using $$\nu = \bar{\nu}_c + \Delta\nu,$$

this expansion can be written as $$\Delta\beta(\nu,T)L|_{T=T_0+\Delta T} \approx$$

$$\Delta\beta(\nu,T)L|_{T=T_0} + \left[\Delta\beta(\bar{\nu}_c,T)\frac{\partial L}{\partial T}\bigg|_{T=T_0} + \frac{\partial\Delta\beta(\bar{\nu}_c,T)}{\partial T}L\bigg|_{T=T_0}\right]\Delta T$$

where terms in second order incrementals are neglected. Substituting the thermal coefficient of linear expansion, $\zeta$, of the length of waveguide 33, or $$\sigma \triangleq \frac{\frac{\partial L}{\partial T}}{L},$$

gives $$\Delta\beta(\nu,T)L|_{T=T_0+\Delta T} \approx \Delta\beta(\nu,T)L|_{T=T_0} +$$

$$L\left[\Delta\beta(\bar{\nu}_c,T)\sigma + \frac{\partial\Delta\beta(\bar{\nu}_c,T)}{\partial T}\right]\Delta T$$

since a linear approximation is being used in expanding the total phase with respect to temperature, there is no longer a need to indicate the value of T at which the derivatives are being evaluated and that notation is dropped in this last equation.

The sine term under the integral in the governing equation for the added feedback loop in the system of FIG. 2 is then expanded over both of the variables $\nu$ and T to the extent of a linear approximation for the dependence on each. Using the results obtained above for the expansion over the total phase in terms of $\nu$, and the results just obtained from expansion in terms of temperature, the sine function can be approximated as $$\sin[\Delta\beta(\nu,T)L] \approx \pm\left((\bar{\nu}-\nu)_c\frac{\partial\Delta\beta(\bar{\nu}_c,T)}{\partial\nu}L + \Delta\beta(\bar{\nu}_c,T)L\sigma\Delta T + \frac{\partial\Delta\beta(\bar{\nu}_c,T)}{\partial T}L\Delta T\right)$$

using trigonometric identity and small angle approximations. The derivative with respect to $\nu$ is again intended to be evaluated at $\bar{\nu}_c$, but in view of the linear approximation any notation showing this has been omitted. Substituting this result into the equation covering the operation of the added feedback loop in the system of FIG. 2 gives the result $$\frac{\partial\Delta\beta(\bar{\nu}_c,T)}{\partial\nu}\int(\nu-\bar{\nu}_c)P_{11}(\nu)d\nu +$$

$$\frac{\partial\Delta\beta(\bar{\nu}_c,T)}{\partial T}\left[\int P_{11}(\nu)d\nu\right]\Delta T + \sigma\Delta\beta(\bar{\nu}_c,T)\left[\int P_{11}(\nu)d\nu\right]\Delta T = 0.$$

The dependence of the derivatives of $\Delta\beta(\bar{\nu}_c,T)$ on the optical frequency $\nu$ are much weaker than the dependency of source emission spectrum $P_{11}(\nu)$ because of the natures of source 11 and double mode phase modulator 30 formed in substrate 36'. This difference justifies taking these derivatives outside the integrals in this last expression.

The last expression can be solved for $\bar{\nu}_c$ to yield $$\bar{\nu}_c = \frac{\int P_{11}(\nu)\nu d\nu}{\int P_{11}(\nu)d\nu} + \frac{\left[\frac{\partial\beta(\bar{\nu}_c,T)}{\partial T} + \sigma\Delta\beta(\bar{\nu}_c,T)\right]\Delta T}{\frac{\partial\Delta\beta(\bar{\nu}_c,T)}{\partial\nu}}$$

where the first term on the right is the value of $\bar{\nu}_c$ prior to any temperature perturbation, and thus is a constant in effect with respect to temperature here. Differentiating this result to determine the average wavelength change with temperature to first order results in obtaining $$\frac{d\bar{\nu}_c}{dT} = \frac{\frac{\partial\beta(\bar{\nu}_c,T)}{\partial T} + \sigma\Delta\beta(\bar{\nu}_c,T)}{\frac{\partial\Delta\beta(\bar{\nu}_c,T)}{\partial\nu}}$$

indicating the change with temperature of the scale factor relating the output signal to the gyroscope rotation rate.

Clearly, once again the importance is emphasized of operating double mode phase modulator 30 well away from the trough in the output characteristic thereof shown in FIG. 5 since the denominator of this last expression is the derivative of the differential propagation "constant" with respect to $\nu$. A low value of that derivative will strongly increase the scale factor dependence on temperature.

On the other hand, the numerator offers the possibility of an opportunity to design out any temperature dependence by setting $$\frac{\partial\beta(\bar{\nu}_c,T)}{\partial T} + \sigma\Delta\beta(\bar{\nu}_c,T) = 0,$$

that is, setting the waveguide length coefficient external expansion equal to the negative of the normalized rate of differential propagation "constant" change with temperature, or $$\sigma = - \frac{1}{\Delta\beta(\bar{v}_o,T)} \frac{\partial\beta(\bar{v}_o,T)}{\partial T}.$$

This can be accomplished through choosing the mounting base for substrate 36' to have its own coefficient of thermal expansion with values so as to change the effective coefficient of thermal expansion for both the mount and the substrate to a value set by the last equation. Thus, the temperature dependence in the scale factor could be much reduced or eliminated. On the other hand, the knowledge of the temperature dependence of the average optical frequency permits use of a compensating means to adjust the output signal accordingly to remove the temperature dependence. Of course, both the mounting design to reduce temperature dependence of the average optical frequency and a compensation arrangement to remove what dependency remains could be used.

Although the present invention has been described with reference to preferred embodiments, workers skilled in the art will recognize that changes may be made in form and detail without departing from the spirit and scope of the invention.

What is claimed is:

1. A spectrum stabilizer for stabilizing with respect to wavelength an emission spectrum of those source electromagnetic waves from a source which are inserted into a selected optical system to propagate at least in part therethrough to impinge on a system photodetector means for detecting electromagnetic waves, said source being capable of having said emission spectrum thereof shifted over wavelengths by varying a source parameter associated therewith, said stabilizer comprising:

a double mode wave guide means coupled to a selected location in said optical system to receive, as input electromagnetic waves, those versions of said source electromagnetic waves that become available at said selected location due to having propagated thereto in said optical system, said double mode wave guide means being capable of having said input electromagnetic waves propagate at least in part therethrough in two different spatial modes with differing group velocities for each over at least a range of wavelengths that include at least in part said emission spectrum to thereby provide output electromagnetic waves at an output thereof;

a stabilization photodetector means coupled to said double mode wave guide means output so as to have said output electromagnetic waves combined impinge thereon, said stabilization photodetector means being capable of providing an output signal at an output thereof representing those electromagnetic waves impinging thereon; and a source actuator means coupled to said stabilization photodetector means output to receive said stabilization photodetector means output signal as an input signal thereto, said source actuator means being capable of varying said source parameter in accord with input signals received thereby.

2. The apparatus of claim 1 wherein said optical system is a rotation sensor capable of sensing rotation about an axis of a coiled optical fiber to provide a rotation sensor output signal indicative of such rotation through having a pair of electromagnetic waves propagating in said coiled optical fiber in opposite directions and along other optical path portions to reach and leave said coiled optical fiber as they travel along in an optical path to both impinge on the system photodetector means with a phase difference relationship therebetween providing a basis for a resulting system photodetector means output signal at an output thereof.

3. The apparatus of claim 1 wherein said optical system is a rotation sensor capable of sensing rotation about an axis of a coiled optical fiber having a first depolarizer therein to thereby provide a rotation sensor output signal indicative of such rotation through having a pair of electromagnetic waves propagating in said coiled optical fiber, including in said first depolarizer, in opposite directions and along other optical path portions to reach and leave said coiled optical fiber as they travel along in an optical path to both impinge on the system photodetector means with a phase difference relationship therebetween providing a basis for a resulting system photodetector means output signal at an output thereof.

4. The apparatus of claim 1 wherein said double mode waveguide means comprises a piezoelectric material core about which an optical fiber means is wrapped in which there is at least a portion through which electromagnetic waves are propagated in two spatial modes.

5. The apparatus of claim 1 wherein said double mode waveguide means comprises an integrated optics chip having a substrate in which is provided a waveguide for electromagnetic waves through which at least in part electromagnetic waves can propagate in two spatial modes.

6. The apparatus of claim 1 wherein said source of source electromagnetic waves is a semiconductor diode, and said source actuator means comprises a current controller means for determining amounts of electrical current passing through said semiconductor diode.

7. The apparatus of claim 1 wherein said source of source electromagnetic waves is a semiconductor diode, and said source actuator means comprises an electrical heating means placed about said semiconductor diode and a heating means controller for controlling temperatures of said electrical heating means.

8. The apparatus of claim 1 wherein said source of source electromagnetic waves is a semiconductor diode, and said source actuator means comprises a piezoelectric positioning means capable of altering positions of an emission facet of said semiconductor diode with respect to an optical fiber through which said electromagnetic waves provided by said semiconductor diode at said emission facet thereof are introduced into said optical system, and a positioning means controller for controlling positions of said positioning means.

9. The apparatus of claim 1 further comprising a phase modulation generator having an output which is electrically connected to an electrode provided in said double mode wave guide means adjacent to locations in which electromagnetic waves in each of said two spatial modes propagate, said phase modulation generator providing a periodic output signal at said output thereof; and wherein said source actuator means further comprises a signal component selection means having an input electrically connected to said stabilization photodetector means output to receive said stabilization photodetector means output signal, said signal component selection means being capable of extracting a selected signal component from said stabilization photodetector means output signal and providing an output signal based thereon.

10. The apparatus of claim 2 wherein said coiled optical fiber is formed of polarization-maintaining optical fiber.

11. The apparatus of claim 2 wherein said other optical path portions include at least one phase modulator.

12. The apparatus of claim 2 wherein said source introduces source electromagnetic waves into said optical system through a source coupler at a first source side waveguide therein to reach two loop side waveguides therein one of which is coupled to said double mode waveguide means to provide said input electromagnetic waves thereto, and that one remaining being coupled to a polarizer which is also coupled to a loop directional coupler at a source side waveguide therein, said loop coupler having a pair of loop side waveguides therein each coupled to a corresponding side of said coiled optical fiber, said source coupler having a second source side waveguide coupled to said system photodetector means.

13. The apparatus of claim 3 wherein said coiled optical fiber is formed of ordinary single mode optical fiber other than said first depolarizer.

14. The apparatus of claim 3 wherein said other optical path portions include at least one phase modulator.

15. The apparatus of claim 3 wherein said source introduces source electromagnetic waves into said optical system through a source coupler at a first source side waveguide therein to reach two loop side waveguides therein one of which is coupled to said double mode waveguide means to provide said input electromagnetic waves thereto, and that one remaining being coupled to a polarizer which is also coupled to a loop directional coupler at a source side waveguide therein, said loop coupler having a pair of loop side waveguides therein each coupled to a corresponding side of said coiled optical fiber, said source coupler having a second source side waveguide coupled to said system photodetector means.

16. The apparatus of claim 5 wherein said waveguide in said double mode waveguide means is divided into a first input waveguide which can propagate one spatial mode, a double mode waveguide which can propagate said two spatial modes, and an output waveguide which can propagate a single spatial mode.

17. The apparatus of claim 5 wherein said integrated optics chip substrate is mounted on a mounting means capable of altering a thermal coefficient of expansion of said waveguide, in a direction parallel to that direction followed in propagating electromagnetic waves in said two spatial modes, to a resulting effective thermal coefficient of expansion of said waveguide in that direction as a result of a thermal coefficient of expansion of said mounting means, said resulting effective thermal coefficient of expansion of said waveguide in said direction being approximately equal to a normalized value of a rate of change of that differential propagation "constant" between said two spatial modes with respect to temperature.

18. The apparatus of claim 7 wherein said source actuator means further comprises a current controller means for determining amounts of electrical current passing through said semiconductor diode.

19. The apparatus of claim 7 wherein said source actuator means further comprises a piezoelectric positioning means capable of altering positions of an emission facet of said semiconductor diode with respect to an optical fiber through which said electromagnetic waves provided by said semiconductor diode at said emission facet thereof are introduced into said optical system, and a positioning means controller for controlling positions of said positioning means.

20. The apparatus of claim 8 wherein said source actuator means further comprises a current controller means for determining amounts of electrical current passing through said semiconductor diode.

21. The apparatus of claim 12 wherein said double mode waveguide means comprises an integrated optic chip having a substrate supporting a waveguide for electromagnetic waves through which at least in part electromagnetic waves can propagate in two spatial modes, and wherein said substrate has further provided therein said polarizer, said loop coupler, and a phase modulator in said other optical path portions.

22. The apparatus of claim 15 wherein said double mode waveguide means comprises an integrated optic chip having a substrate supporting a waveguide for electromagnetic waves through which at least in part electromagnetic waves can propagate in two spatial modes, and wherein said substrate has further provided therein said polarizer, said loop coupler, and a phase modulator in said other optical path portions.

23. A source controller for controlling an emission spectrum and intensity of a source of those electromagnetic waves from a source which are introduced into a selected optical system to propagate at least in part therethrough, said source being capable of having said intensity of electromagnetic waves emitted therefrom being varied, and of having said emission spectrum thereof being shifted over wavelengths, by varying either of first and second source parameters associated with that source with said first parameter being positions of an emission facet of said source with respect to an optical fiber through which said electromagnetic waves provided by said source at said emission facet thereof are introduced into said optical system, said source controller comprising;
  a system intensity determination means capable of providing an output signal at an output thereof indicative of that intensity desired for those electromagnetic waves emitted by said source;
  a system spectrum determination means capable of providing an output signal at an output thereof indicative of that range of wavelengths desired over which said emission spectrum of those electromagnetic waves emitted by said source is to occur; and
  a source actuator means coupled to said system intensity determination means and to said system emission spectrum determination means at said outputs thereof to receive said output signals therefrom as input signals thereto, said source actuator means being capable of varying said first and second source parameters in accord with said input signals received thereby.

24. The apparatus of claim 23 wherein said system intensity determination means is coupled to said optical system at a selected location therein to receive as input electromagnetic waves those versions of said electromagnetic waves that become available at said selected location due to having propagated thereto in said optical system.

25. The apparatus of claim 23 wherein said system spectrum determination means is coupled to said optical system at a selected location therein to receive as input electromagnetic waves those versions of said electromagnetic waves that become available at said selected location due to having propagated thereto in said optical system.

26. The apparatus of claim 23 wherein said source actuator means comprises a memory means containing data representing those changes in said intensity of electromagnetic waves and those changes in wavelengths over which said emission spectra occurs of those electromagnetic waves emitted by said source in response to changes in said first source parameter and to changes in said second source parameter.

27. The apparatus of claim 26 wherein said source actuator means further comprises a calculating means which uses said data in said memory means and values of said input signals to said source actuator means to calculate values for said first and second source parameters to cause said source actuator means to vary said first and second source parameters to values causing said source to emit electromagnetic waves of said intensity desired therefor and having an emission spectrum over wavelengths desired therefor.

* * * * *